(12) United States Patent
Birmingham

(10) Patent No.: US 11,649,525 B2
(45) Date of Patent: May 16, 2023

(54) SINGLE ELECTRON TRANSISTOR (SET), CIRCUIT CONTAINING SET AND ENERGY HARVESTING DEVICE, AND FABRICATION METHOD

(71) Applicant: Birmingham Technologies, Inc., Arlington, VA (US)

(72) Inventor: Joseph Birmingham, Arlington, VA (US)

(*) Notice: Subject to any disclaimer, the term of this patent is extended or adjusted under 35 U.S.C. 154(b) by 127 days.

(21) Appl. No.: 16/864,759

(22) Filed: May 1, 2020

(65) Prior Publication Data

US 2021/0343960 A1    Nov. 4, 2021

(51) Int. Cl.
| | | |
|---|---|---|
| H01L 51/05 | (2006.01) | |
| H01L 51/00 | (2006.01) | |
| B82Y 10/00 | (2011.01) | |
| B82Y 40/00 | (2011.01) | |

(52) U.S. Cl.
CPC ...... *H01L 51/0562* (2013.01); *H01L 51/0048* (2013.01); *B82Y 10/00* (2013.01); *B82Y 40/00* (2013.01)

(58) Field of Classification Search
CPC ............... B82Y 10/00; H01L 29/7613; H01L 29/66439
See application file for complete search history.

(56) References Cited

U.S. PATENT DOCUMENTS

| | | |
|---|---|---|
| 2,876,368 A | 3/1959 | Thomas |
| 3,376,437 A | 4/1968 | Meyerand, Jr. et al. |
| 3,798,475 A | 3/1974 | Campagnuolo et al. |
| 3,839,094 A | 10/1974 | Campagnuolo |

(Continued)

FOREIGN PATENT DOCUMENTS

| | | |
|---|---|---|
| CN | 100382256 | 4/2008 |
| CN | 106452287 | 6/2018 |

(Continued)

OTHER PUBLICATIONS

International Search Report for PCT/US2021/029351, dated Jul. 2021.

(Continued)

*Primary Examiner* — Raj R Gupta
(74) *Attorney, Agent, or Firm* — Sheets Law PLLC; Kendal M. Sheets

(57) ABSTRACT

A method for fabricating a single electron transistor is provided. A substrate includes a substantially planar surface with a source electrode, a drain electrode, and a gate electrode thereon, with the source and drain electrodes spaced apart from one another by a gap. The source electrode and the drain electrode are electrified, and a single nanometer-scale conductive particle is electrospray deposited in the gap. The single nanometer-scale conductive particle has an effective size of not greater than 10 nanometers. At least one carbon nanotube is deposited on the substrate and subjected to dielectrophoresis to position the carbon nanotube within 1 nanometer of the single nanometer-scale conductive particle. The at least one carbon nanotube establishes a first connection between the source electrode and the single nanometer-scale conductive particle and a second connection between the drain electrode and the single nanometer-scale conductive particle.

20 Claims, 13 Drawing Sheets

(56) References Cited

U.S. PATENT DOCUMENTS

| | | | |
|---|---|---|---|
| 4,264,641 A | 4/1981 | Mahoney et al. |
| 4,628,143 A | 12/1986 | Brotz |
| 4,762,975 A | 8/1988 | Mahoney et al. |
| 4,900,368 A | 2/1990 | Brotz |
| 4,995,231 A | 2/1991 | Smith et al. |
| 5,008,579 A | 4/1991 | Conley et al. |
| 5,578,886 A | 11/1996 | Holmlid et al. |
| 5,606,213 A | 2/1997 | Kherani et al. |
| 5,787,965 A | 8/1998 | Sterett et al. |
| 5,960,853 A | 10/1999 | Sterett et al. |
| 5,989,824 A | 11/1999 | Birmingham et al. |
| 5,994,638 A | 11/1999 | Edelson |
| 6,062,392 A | 5/2000 | Birmingham et al. |
| 6,110,247 A | 8/2000 | Birmingham et al. |
| 6,287,714 B1 | 9/2001 | Xiao et al. |
| 6,294,858 B1 | 9/2001 | King et al. |
| 6,492,792 B1 | 12/2002 | Johnson, Jr. et al. |
| 6,722,872 B1 | 4/2004 | Swanson et al. |
| 6,774,532 B1 | 8/2004 | Marshall et al. |
| 7,073,561 B1 | 7/2006 | Henn |
| 7,081,684 B2 | 7/2006 | Patel et al. |
| 7,259,109 B2 | 8/2007 | Meagley |
| 7,327,026 B2 | 2/2008 | Shimogishi et al. |
| 7,524,528 B2 | 4/2009 | Kodas et al. |
| 7,651,926 B2 | 1/2010 | Jacobson et al. |
| 7,701,576 B2 | 4/2010 | Moore et al. |
| 7,737,356 B2 | 5/2010 | Goldstein |
| 7,906,182 B1 | 3/2011 | Schlaf |
| 8,093,144 B2 | 1/2012 | Jacobson et al. |
| 8,182,982 B2 | 5/2012 | Kobrin |
| 8,188,456 B2 | 5/2012 | Nemanich et al. |
| 8,192,920 B2 | 6/2012 | Kobrin |
| 8,318,386 B2 | 11/2012 | Kobrin |
| 8,334,217 B2 | 12/2012 | Kobrin |
| 8,367,525 B2 | 2/2013 | Jacobson et al. |
| 8,425,789 B2 | 4/2013 | Kobrin |
| 8,518,633 B1 | 8/2013 | Kobrin et al. |
| 8,621,245 B2 | 12/2013 | Shearer et al. |
| 8,816,633 B1 | 8/2014 | Neal et al. |
| 8,907,352 B2 | 12/2014 | Naito |
| 9,069,244 B2 | 6/2015 | Kobrin |
| 9,073,937 B2 | 7/2015 | Frazier et al. |
| 9,116,430 B2 | 8/2015 | Kobrin et al. |
| 9,166,405 B2 | 10/2015 | Brandt et al. |
| 9,244,356 B1 | 1/2016 | Kobrin et al. |
| 9,465,296 B2 | 10/2016 | Kobrin |
| 9,472,699 B2 | 10/2016 | Kotter |
| 9,481,112 B2 | 11/2016 | Kobrin et al. |
| 9,559,617 B2 | 1/2017 | Landa et al. |
| 9,645,504 B2 | 5/2017 | Kobrin |
| 9,722,420 B2 | 8/2017 | Teggatz et al. |
| 9,726,790 B2 | 8/2017 | Boyd et al. |
| 9,726,791 B2 | 8/2017 | Boyd et al. |
| 9,782,917 B2 | 10/2017 | Kobrin et al. |
| 9,786,718 B1 | 10/2017 | Boyd |
| 9,793,317 B1 | 10/2017 | Boyd et al. |
| 9,893,261 B1 | 2/2018 | Boyd et al. |
| 9,923,514 B1 | 3/2018 | Boyd et al. |
| 9,981,410 B2 | 5/2018 | Kobrin et al. |
| 10,014,461 B1 | 7/2018 | Boyd et al. |
| 10,056,538 B1 | 8/2018 | Boyd |
| 10,079,561 B1 | 9/2018 | Boyd |
| 10,096,648 B2 | 10/2018 | Boyd |
| 10,103,654 B2 | 10/2018 | Yun et al. |
| 10,109,672 B2 | 10/2018 | Boyd et al. |
| 10,109,781 B1 | 10/2018 | Boyd |
| 10,110,163 B2 | 10/2018 | Boyd et al. |
| 10,247,861 B2 | 4/2019 | Boyd et al. |
| 10,249,810 B2 | 4/2019 | Boyd et al. |
| 10,345,491 B2 | 7/2019 | Boyd et al. |
| 10,345,492 B2 | 7/2019 | Boyd et al. |
| 10,347,777 B2 | 7/2019 | Boyd et al. |
| 10,525,684 B2 | 1/2020 | Boyd et al. |
| 10,529,871 B2 | 1/2020 | Boyd et al. |
| 10,546,991 B2 | 1/2020 | Boyd |
| 10,553,774 B2 | 2/2020 | Boyd |
| 10,559,864 B2 | 2/2020 | Birmingham |
| 10,690,485 B2 | 6/2020 | Koester et al. |
| 10,859,480 B2 | 12/2020 | Koester et al. |
| 10,985,677 B2 | 4/2021 | Boyd et al. |
| 11,380,776 B2 * | 7/2022 | Hsieh .................. H01L 29/0847 |
| 2004/0099304 A1 | 5/2004 | Cox |
| 2005/0016575 A1 | 1/2005 | Kumar et al. |
| 2005/0104185 A1 | 5/2005 | Shimogishi et al. |
| 2006/0068611 A1 | 3/2006 | Weaver, Jr. et al. |
| 2006/0137732 A1 | 6/2006 | Farahani et al. |
| 2007/0182362 A1 | 8/2007 | Trainor et al. |
| 2008/0066796 A1 | 3/2008 | Mitchell et al. |
| 2009/0071526 A1 | 3/2009 | Parker |
| 2009/0140465 A1 | 6/2009 | Plumpton |
| 2010/0051092 A1 | 3/2010 | Dumitru et al. |
| 2010/0068406 A1 | 3/2010 | Man |
| 2010/0326487 A1 | 12/2010 | Komori et al. |
| 2011/0104546 A1 | 5/2011 | Seino et al. |
| 2011/0148248 A1 | 6/2011 | Landa |
| 2012/0153772 A1 | 6/2012 | Landa |
| 2013/0062457 A1 | 3/2013 | Deakin |
| 2013/0101729 A1 | 4/2013 | Keremes et al. |
| 2013/0206199 A1 | 8/2013 | Lassiter et al. |
| 2013/0313745 A1 | 11/2013 | Ikushima |
| 2014/0230875 A1 | 8/2014 | Angermann et al. |
| 2014/0349430 A1 | 11/2014 | Kim |
| 2015/0024516 A1 | 1/2015 | Seibel et al. |
| 2015/0079504 A1 * | 3/2015 | Farrugia .................. B32B 5/16 |
| | | 430/108.1 |
| 2015/0087144 A1 | 3/2015 | Liu et al. |
| 2015/0207457 A1 | 7/2015 | Trucchi et al. |
| 2015/0210400 A1 | 7/2015 | Gonidec et al. |
| 2015/0211499 A1 | 7/2015 | Morin |
| 2015/0229013 A1 | 8/2015 | Birmingham et al. |
| 2015/0243867 A1 | 8/2015 | Geballe et al. |
| 2015/0251213 A1 | 9/2015 | Birmingham et al. |
| 2017/0106082 A1 | 4/2017 | Birmingham |
| 2017/0126150 A1 | 5/2017 | Wang |
| 2017/0155098 A1 | 6/2017 | Park et al. |
| 2017/0252807 A1 | 9/2017 | Lund et al. |
| 2017/0358432 A1 | 12/2017 | Wang |
| 2018/0083176 A1 | 3/2018 | Ryu et al. |
| 2019/0019981 A1 * | 1/2019 | Kim .................. H01L 51/5253 |
| 2019/0214675 A1 | 7/2019 | Christensen et al. |
| 2019/0214845 A1 | 7/2019 | Hausman, Jr. et al. |
| 2019/0267846 A1 | 8/2019 | Shearer et al. |
| 2019/0356267 A1 | 11/2019 | Ganley |
| 2020/0153069 A1 | 5/2020 | Birmingham |
| 2020/0273959 A1 | 8/2020 | Birmingham |
| 2020/0274045 A1 | 8/2020 | Birmingham |
| 2020/0274046 A1 | 8/2020 | Birmingham |
| 2020/0303132 A1 | 9/2020 | Bhattacharjee et al. |
| 2020/0346736 A1 | 11/2020 | Krasnoff |
| 2020/0368848 A1 | 11/2020 | Birmingham |
| 2020/0369516 A1 | 11/2020 | Birmingham |
| 2020/0370158 A1 | 11/2020 | Birmingham |
| 2021/0050800 A1 | 2/2021 | Jones et al. |
| 2021/0050801 A1 * | 2/2021 | Jones .................. H02N 2/183 |
| 2021/0086208 A1 | 3/2021 | Birmingham et al. |
| 2021/0091291 A1 | 3/2021 | Birmingham et al. |
| 2021/0091685 A1 | 3/2021 | Birmingham et al. |
| 2021/0135600 A1 | 5/2021 | Thibado et al. |

FOREIGN PATENT DOCUMENTS

| | | |
|---|---|---|
| EA | 2006076036 | 7/2006 |
| EP | 2849334 | 3/2015 |
| JP | 2006086510 | 3/2006 |
| JP | 4901049 | 3/2012 |
| JP | 6147901 | 6/2017 |
| JP | 6411612 | 10/2018 |
| JP | 6411613 | 10/2018 |
| JP | 6521400 | 5/2019 |
| JP | 6521401 | 5/2019 |
| JP | 6524567 | 6/2019 |
| JP | 6598339 | 10/2020 |
| KR | 20090106247 A * | 10/2009 |
| KR | 20170138772 | 12/2017 |

(56) References Cited

FOREIGN PATENT DOCUMENTS

| KR | 20180107194 | 10/2018 |
| WO | 2009004345 | 1/2009 |
| WO | 2012114366 | 8/2012 |
| WO | 2014186783 | 11/2014 |
| WO | 2014204549 | 12/2014 |
| WO | 2017214179 | 12/2017 |
| WO | 2020176344 | 9/2020 |
| WO | 2020176345 | 9/2020 |
| WO | 2020184234 | 9/2020 |
| WO | 2020184235 | 9/2020 |
| WO | 2020235254 | 11/2020 |
| WO | 2020236776 | 11/2020 |
| WO | 2021030489 | 2/2021 |
| WO | 2021061995 | 4/2021 |
| WO | 2021061996 | 4/2021 |
| WO | 2021061997 | 4/2021 |
| WO | WO-2021191629 A1 * | 9/2021 |

OTHER PUBLICATIONS

Satterley, C.J. et al., "Electrospray deposition of fullerenes in ultra-high vacuum: in situ scanning tunneling microscopy and photoemission spectroscopy," Nanotechnology, vol. 18, p. 455304 (2007).
Shin, H. et al., "Improved electrical performance and transparency of bottom-gate, bottom-contact single-walled carbon nanotube transistors using graphene source/drain electrodes," Journal of Industrial and Engineering Chemistry, vol. 81, pp. 488-495 (2020).
International Search Report for PCT/US2021/037166, dated Sep. 2021.
Notice of Allowance for U.S. Appl. No. 16/745,071, dated Oct. 2021.
Bell, Lon E., "Cooling, heating, generating power, and recovering waste heat with thermoelectric systems," Science, vol. 321, pp. 1457-1461 (2008).
Bhadrachalam, Pradeep et al., "Energy-filtered cold electron transport at room temperature," Nature Communications, Sep. 10, 2014.
Brezonik, Patrick L. et al., "Water Chemistry: an Introduction to the Chemistry of Natural and Engineered Aquatic Systems," Oxford University Press, Inc., pp. 170-175 (2011).
Chung, M.S. et al., "Energy exchange processes in electron emission at high fields and temperatures," Journal of Vacuum Science and Technology B, vol. 12, pp. 727-736 (1994).
Cronin, J.L., "Modern dispenser cathodes," IEE Proc., vol. 128, Pt. 1, No. 1, pp. 19-32 (1981).
Curzon, F.L. et al., "Efficiency of a Carnot engine at maximum power output," American Journal of Physics, vol. 43, pp. 22-24 (1975).
Cutler, P.H. et al., "A new model for the replacement process in electron emission at high fields and temperatures," Applied Surface Science, vol. 76-77, pp. 1-6 (1994).
Daniel, Marie-Christine et al., "Gold Nanoparticles: Assembly, Supramolecular Chemistry, Quantum-Size-Related Properties, and Applications toward Biology, Catalysis, and Nanotechnology," Chemical Reviews, vol. 104, No. 1, pp. 293-346 (2004).
Deng et al., "Digital electrospray for controlled deposition," Review of Scientific Instruments, vol. 81, pp. 035114-1-035114-6 (2010).
Deng, Weiwei et al., "Influence of space charge on the scale-up of multiplexed electrosprays," Aerosol Science 38, pp. 1062-1078 (2007).
Dillner, U., "The effect of thermotunneling on the thermoelectric figure of merit," Energy Conversion and Management, vol. 49, No. 12, pp. 3409-3425 (2008).
Fisher, T.S. et al., "Thermal and Electrical Energy Transport and Conversion in Nanoscale Electron Field Emission Processes," Journal of Heat Transfer, vol. 124, pp. 954-962 (2002).
Fu, Xinyong et al., "Realization of Maxwell's Hypothesis," Shanghai Jiao Tong University (2008).

Hishinuma, Y. et al., "Refrigeration by combined tunneling and thermionic emission in vacuum: use of nanometer scale design," Applied Physics Letters, vol. 78, No. 17, pp. 2572-2574 (2001).
Hishinuma, Yoshikazu et al., "Measurements of cooling by room-temperature thermionic emission across a nanometer gap," Journal of Applied Physics, vol. 94, No. 7, p. 4690 (2003).
Ioffe, A.F., "Semiconductor Thermoelements and Thermoelectric Cooling Infosearch," Infosearch Ltd., 1957.
Klimeck et al., "Quantum device simulation with a generalized tunneling formula," Appl. Phys. Lett., vol. 67, pp. 2539-2541 (1995).
Koeck, Franz A.M. et al., "Thermionic electron emission from low work-function phosphorus doped diamond films," Diamond Related Material, vol. 18, pp. 789-791 (2009).
Landauer, R., "Spatial Variation of Currents and Fields Due to Localized Scatterers in Metallic Conduction," IBM Journal of Research and Development, vol. 1, pp. 223-231 (1957).
Likharev, Konstantin K., "Single-Electron Devices and Their Applications," Proc. IEEE, vol. 87, pp. 606-632 (1999).
Mahan, G.D., "Thermionic refrigeration," Journal of Applied Physics, vol. 76, No. 7, pp. 4362-4366 (1994).
Marzari, Nicola et al., "Maximally localized generalized Wannier functions for composite energy bands," Physical Review B, vol. 56, No. 20, pp. 12847-12865 (1997).
Muller-Steinhagen, Hans et al., "Concentrating solar power," Ingenia, pp. 1-9 (2004).
Murray, Royce W., "Nanoelectrochemistry: Metal Nanoparticles, Nanoelectrodes, and Nanopores," Chemical Reviews, vol. 108, No. 7, pp. 2688-2720 (2008).
Nguyen, Hoang M. et al., "Thermionic emission via a nanofluid for direct electrification from low-grade heat energy," Nano Energy, vol. 49, pp. 172-178 (2018).
Obraztsov, Alexander et al., "Cold and Laser Stimulated Electron Emission from Nanocarbons," Journal Nanoelectronics and Optoelectronics, vol. 4, pp. 1-13 (2009).
Redko, Mikhail et al., "Design and Synthesis of a Thermally Stable Organic Electride," J. Am. Chem. Soc., vol. 127, No. 35, pp. 12416-12422 (2005).
Rusu, Paul et al., "Work functions of self-assembled monolayers on metal surfaces by first-principles calculations," Physical Review B, vol. 74, pp. 073414-1-073414-4 (2006).
Scheible, Dominik V. et al., "Tunable coupled nanomechanical resonators for single-electron transport," New Journal of Physics, vol. 4, pp. 86.1-86.7 (2002).
Schreiber, Frank, "Structure and growth of self-assembling monolayers," Progress in Surface Science, vol. 65, pp. 151-256 (2000).
Shakouri, Ali, "Nanoscale Thermal Transport and Microrefrigerators on a Chip," Proceedings of the IEEE, vol. 94, No. 8, pp. 1613-1638 (2006).
Shockley, William et al., "Detailed Balance Limit of Efficiency of pn Junction Solar Cells," Journal of Applied Physics, vol. 32, pp. 510-519 (1961).
Snider, D.R. et al., "Variational calculation of the work function for small metal spheres," Solid State Communications, vol. 47, No. 10, pp. 845-849 (1983).
Snyder, G. et al., "Complex thermoelectric materials," Nature Materials, vol. 7, pp. 105-114 (2008).
Sodha, M.S. et al., "Dependence of Fermi energy on size," Journal of Physics D: Applied Physics, vol. 3, No. 2, pp. 139-144 (1970).
Stephanos, Cyril, "Thermoelectronic Power Generation from Solar Radiation and Heat," University of Augsburg, Ph. D. Thesis, Nov. 2012.
Templeton, Allen C. et al., "Monolayer-Protected Cluster Molecules," Accounts of Chemical Research, vol. 33, No. 1, pp. 27-36 (2000).
Tepper, Gary et al., "An electrospray-based, ozone-free air purification technology," Journal of Applied Physics, vol. 102, pp. 113305-1-113305-6 (2007).
Thygesen, Kristian S. et al., "Partly occupied Wannier functions," Physical Review Letters, vol. 94, pp. 026405-1-026405-4 (2005).
Ulrich, Marc D. et al., "Comparison of solid-state thermionic refrigeration with thermoelectric refrigeration," Journal of Applied Physics, vol. 90, No. 3, pp. 1625-1631 (2001).

(56) References Cited

OTHER PUBLICATIONS

Wada, Motoi et al., "Effective Work Function of an Oxide Cathode in Plasma," J. Plasma Fusion Res. Series, vol. 8, pp. 1366-1369 (2009).

Watanabe, Satoru et al., "Secondary electron emission and glow discharge properties of 12CaO—7Al2O3 electride for fluorescent lamp applications," Science and Technology of Advanced Materials, vol. 12, pp. 1-8 (2011).

Weaver, Stan et al., "Thermotunneling Based Cooling Systems for High Efficiency Buildings," GE Global Research, DOE Project: DE-FC26-04NT42324 (2007).

Weiss, C. et al., "Accuracy of a mechanical single-electron shuttle," Europhysics Letters, vol. 47, No. 1, p. 97 (1999).

Yamamoto, Shigehiko, "Fundamental physics of vacuum electron sources," Reports on Progress in Physics, vol. 69, pp. 181-232 (2006).

Zharin, Anatoly L. et al., "Application of the contact potential difference technique for on-line rubbing surface monitoring (review)," Tribology Letters, vol. 4, pp. 205-213 (1998).

Zhu, Moxuan, "Experimental Measurements of Thermoelectric Phenomena in Nanoparticle Liquid Suspensions (Nanofluids)," Graduate Thesis, Arizona State University, Dec. 2010.

Benedict, Lorin X. et al., "Static polarizabilities of single-wall carbon nanotubes," Physical Review B, vol. 52, pp. 8541-8549 (1995).

Birmingham, Joseph, "Printed Self-Powered Miniature Air Sampling Sensors," Sensors and Transducers, vol. 214, pp. 1-11 (2017).

Chattopadhyay, Debjit et al., "Complete elimination of metal catalysts from single wall carbon nanotubes," Carbon, vol. 40, pp. 985-988 (2002).

Chen, Zhihong et al., "An Integrated Logic Circuit Assembled on a Single Carbon Nanotube," Science, vol. 311, p. 1735 (2006).

Dillon, A.C. et al., "A Simple and Complete Purification of Single-Walled Carbon Nanotube Materials," Advanced Materials, vol. 11, pp. 1354-1358 (1999).

Dimaki, Maria et al., "Frequency dependence of the structure and electrical behaviour of carbon nanotube networks assembled by dielectrophoresis," Nanotechnology, vol. 16, pp. 759-763 (2005).

Dimaki, Maria et al., "Single and multiwalled carbon nanotube networks and bundles assembled on microelectrodes," Proceedings of the Institution of Mechanical Engineers, Part N: Journal of Nanoengineering and Nanosystems, vol. 218, pp. 17-23 (2005).

Green, Nicolas G. et al., "Dielectrophoresis of Submicrometer Latex Spheres. 1. Experimental Results," Journal of Phsysical Chemistry B, vol. 103, pp. 41-50 (1999).

Krupke, R. et al., "Simultaneous Deposition of Metallic Bundles of Single-walled Carbon Nanotubes Using Ac-dielectrophoresis," Nano Letters, vol. 3, pp. 1019-1023 (2003).

Krupke, Ralph et al., "Separation of Metallic from Semiconducting Single-Walled Carbon Nanotubes," Science, vol. 301, pp. 344-347 (2003).

Krupke, Ralph et al., "Surface Conductance Induced Dielectrophoresis of Semiconducting Single-Walled Carbon Nanotubes," Nano Letters, vol. 4, pp. 1395-1399 (2004).

Murata, Kazuhiro, "Super-fine ink-jet printing for nanotechnology," Proceedings International Conference on MEMS, NANO and Smart Systems, pp. 346-349 (2003).

Park, Jang-Ung et al., ""High-resolution electrohydrodynamicjet printing,"" Nature Materials, vol. 6, pp. 782-789 (2007).

Park, Jang-Ung et al., "Nanoscale Patterns of Oligonucleotides Formed by Electrohydrodynamic Jet Printing with Applications in Biosensing and Nanomaterials Assembly," Nano Letters, vol. 8, pp. 4210-4216 (2008).

Schneider, Julian, "Electrohydrodynamic nanoprinting and its applications," Diss. EIH No. 22694 (2015).

Vaccarini, L. et al., "Purification procedure of carbon nanotubes," Synthetic Metals, vol. 103, pp. 2492-2493 (1999).

Go, David B. et al., "Thermionic Energy Conversion in the Twenty-first Century: Advances and Opportunities for Space and Terrestrial Applications," Frontiers in Mechanical Engineering, vol. 3 (2017).

List of Birmingham Technologies Patents or Applications Treated as Related, May 2020.

International Search Report for PCT/US2020/033528, dated Aug. 2020.

Updated International Search Report PCT/US2021/050831, dated Apr. 20, 2022.

Updated Written Opinion PCT/US2021/050831, dated Apr. 20, 2022.

Office Action, U.S. Appl. No. 16/817,112, dated Apr. 12, 2022.

Office Action, U.S. Appl. No. 16/817,122, dated Apr. 7, 2022.

Eaton Ellipse ECO spec sheet, pp. 1-2 (2011).

M, Hyeongwook, et al., "High-efficiency electrochemical thermal energy harvester using carbon nanotube aerogel sheet electrodes", Nature Communications 7, Article No. 10600, (2016).

Pearson, Amanda, "10 advantages of 3D printing", (2018).

Zebarjadi, Mona, "Thermionic and Thermoelectric Power Generators", University of Virginia, (2010), pp. 1-19.

International Search Report for PCT/US2020/019230, dated Jun. 2020.

International Search Report for PCT/US2020/019232, dated Jun. 2020.

Office Action for U.S. Appl. No. 16/284,967, dated Jul. 2020.

Alhuwaidi, S.A., "3D Modeling Analysis, and Design of a Traveling-Wave Tube Using a Modified Ring-Bar Structure with Rectangular Transmission Lines Geometry," Dissertation submitted to the University of Colorado Colorado Springs (2017).

Birmingham, J.G., "DEP-Enhanced Micro-Injector Array for Liquid Fuel Atomizer," Final Report for U.S. Army SBIR 02.2 N02-148 (2001).

Birmingham, J.G., "E-Field Micro-Injector Array Liquid Fuel Atomizer," Final Report for NASA SBIR Phase I: NASA 01.1-A8.02 (2002).

Brodie, I. et al., "Impregnated Barium Dispenser Cathodes Containing Strontium or Calcium Oxide," Journal of Applied Physics, vol. 27, pp. 417-418 (1956).

Brodie, I. et al., "Secondary electron emission from barium dispenser cathodes," British Journal of Applied Physics, vol. 8, pp. 202-204 (1957).

Chou, S.H. et al.,"An orbital-overlap model for minimal work functions of cesiated metal surfaces," Journal of Physics: Condensed Matter, vol. 24, p. 445007 (2012).

Committee on Thermionic Research and Technology et al., "Thermionics: Quo Vadis? An Assessment of the DTRA's Advanced Thermionics Research and Development Program," National Academy Press (2001).

Datta, S., "Electronic Transport in Mesoscopic Systems," Cambridge University Press, New York, pp. 246-275 (1995).

Fall, C.J. et al., "Deriving accurate work functions from thin-slab calculations," Journal of Physics: Condensed Matter, vol. 11 2689-2696 (1999).

Fall, C.J. et al., "Theoretical maps of work-function anisotropies," Physical Review B, vol. 65, p. 045401 (2001).

Fomenko, V.S., "Handbook of Thermionic Properties, Electronic Work Functions and Richardson Constants of Elements and Compounds," Plenum Press Data Division, New York, pp. 126-137 (1966).

Giordano, L. et al., "Tuning the surface metal work function by deposition of ultrathin oxide films: Density functional calculations," Physical Review B, vol. 73, p. 045414 (2005).

Gyftopoulos, E.P. et al., "Work Function Variation of Metals Coated by Metallic Films," Journal of Applied Physics, vol. 33, pp. 6-737 (1962).

Haas, G.A. et al., "Interatomic Auger Analysis of the Oxidation of Thin Ba Films," Applications of Surface Science, vol. 16, pp. 139-162 (1983).

Hafner, J. et al., "Toward Computational Materials Design: the Impact of Density Functional Theory on Materials Research," MRS Bulletin, vol. 31, pp. 659-668 (2006).

Hatsopoulos, G.N. et al., "Thermionic Energy Conversion vol. I: Process and Devices," The MIT Press, Cambridge, MA, pp. 5-37 (1973).

Houston, J.M., "Theoretical Efficiency of the Thermionic Energy Converter," Journal of Applied Physics, vol. 30, pp. 481-487 (1959).

(56) References Cited

OTHER PUBLICATIONS

Incropera, F.P. et al., "Fundamentals of Heat and Mass Transfer, 6th Edition," John Wiley & Sons, pp. 2-42 (2007).
Jensen, K.L. et al., "A photoemission model for low work function coated metal surfaces and its experimental validation," Journal of Applied Physics, vol. 99, p. 124905 (2006).
Kawano, H., "Effective work functions for ionic and electronic emissions from mono- and polycrystalline surfaces," Progress in Surface Science, vol. 83, pp. 1-165 (2008).
Lee, J.-H. et al, "Thermionic Emission From Microfabricated Silicon-Carbide Filaments," Proceedings Power MEMS, pp. 149-152 (2009).
Lenggoro, I.W. et al., "Nanoparticle Assembly on Patterned "plus/minus" Surfaces From Electrospray of Colloidal Dispersion," Journal of Colloid and Interface Science, vol. 303, pp. 124-130 (2006).
Levine, J.D., "Structural and Electronic Model of Negative Electron Affinity on The Si/Cs/O Surface," Surface Science, vol. 34, pp. 90-107 (1973).
Lin, M.C. et al., "Work functions of cathode surfaces with adsorbed atoms based on ab initio calculations," Journal of Vacuum Science and Technology B, vol. 26, pp. 821-825 (2008).
Lindell, L. et al., "Transparent, Plastic, Low-Work-Function Poly (3,4-ethylenedioxythiophene) Electrodes," Chemistry of Materials, vol. 18, pp. 4246-4252 (2006).
Love, J.C. et al., "Self-Assembled Monolayers of Thiolates on Metals as a Form of Nanotechnology," Chemical Reviews, vol. 105, pp. 1103-1169 (2005).
Maboudian, R. et al., "Critical Review: Adhesion in surface micromechanical structures," Journal of Vacuum Science and Technology B, vol. 15, pp. 1-20 (1997).
Maboudian, R. et al., "Self-assembled monolayers as anti-stiction coatings for MEMS: characteristics and recent developments," Sensors and Actuators, vol. 82, pp. 219-223 (2000).
Maboudian, R., "Surface processes in MEMS technology," Surface Science Reports, vol. 30, 207-269 (1998).
Magkoev, T.T. et al., "Aluminium oxide ultrathin-film growth on the Mo(110) surface: a work-function study," Journal of Physics: Condensed Matter, vol. 13, pp. L655-L661 (2001).
Modinos, A., "Theory of Thermionic Emission," Surface Science, vol. 115, pp. 469-500 (1982).
Morris, J.E., "Nanopackaging: Nanotechnologies and Electronics Packaging," Springer-Verlag, pp. 93-107 (2008).
Musho, T.D. et al., "Quantum simulation of thermionic emission from diamond films," Journal of Vacuum Science and Technology B, vol. 31, p. 021401 (2013).
Natan, A. et al., "Computing surface dipoles and potentials of self-assembled monolayers from first principles," Applied Surface Science, vol. 252, pp. 7608-7613 (2006).
Neugebauer, J. et al., "Adsorbate-substrate and adsorbate-adsorbate interactions of Na and K adlayers on Al (111)," Physical Review B, vol. 46, pp. 16067-16080 (1992).
Nichols, M.H., "The Thermionic Constants of Tungsten as a Function of Crystallographic Direction," Physical Review, vol. 57, pp. 297-306 (1940).
Prada, S. et al., "Work function changes induced by deposition of ultrathin dielectric films on metals: a theoretical analysis," Physical Review B, vol. 78, p. 235423 (2008).
Schwede, J.W. et al., "Photon-enhanced thermionic emission for solar concentrator systems," Nature Materials, vol. 9, p. 762-767 (2010).
Singh-Miller, N.E. et al., "Surface energies, work functions, and surface relaxations of low-index metallic surfaces from first principles," Physical Review B, vol. 80, p. 235407 (2009).
Vlahos, V. et al., "Ab initio investigation of barium-scandium-oxygen coatings on tungsten for electron emitting cathodes," Physical Review B, vol. 81, p. 054207 (2010).
Wang, C.S., "High photoemission efficiency of submonolayer cesium-covered surfaces," Journal of Applied Physics, vol. 48, pp. 1477-1479 (1977).
Wooten, L.A. et al., "Evaporation of Barium and Strontium from Oxide-Coated Cathodes," Journal of Applied Physics, vol. 26, pp. 44-51 (1955).
Zhao, Y.P., "Morphological stability of epitaxial thin elastic films by van der Waals force," Archive of Applied Mechanics, vol. 72, pp. 77-84 (2002).
Office Action for U.S. Appl. No. 16/284,979, dated Sep. 2020.
Office Action for U.S. Appl. No. 16/416,849, dated Nov. 2020.
Baram, M. et al., "Nanometer-Thick Equilibrium Films: the Interface Between Thermodynamics and Atomistics," Science, vol. 332, Issue 6026, pp. 206-209 (2011).
Bassani, J.L., "Incompatibility and a simple gradient theory of plasticity," Journal of Mechanics and Physics of Solids vol. 49, pp. 1983-1996 (2001).
Battezzati, L. et al., "Solid state reactions in Al/Ni alternate foils induced by cold rolling and annealing," Acta Materialia, vol. 47, Issue 6, pp. 1901-1914 (1999).
Darling, K.A. et al., "Thermal stability of nanocrystalline Fe—Zr alloys," Materials Science and Engineering A, vol. 527, pp. 3572-3580 (2010).
De Juan, L. et al., "Charge and size distribution of electrospray drops," Journal of Colloid Interface Science, vol. 186, No. 2, pp. 280-293 (1997).
Detor, Andrew J. et al., "Grain boundary segregation, chemical ordering and stability of nanocrystalline alloys: Atomistic computer simulations in the Ni—W system," Acta Materialia, vol. 55, pp. 4221-4232 (2007).
Dinda, G.P. et al., "Synthesis of bulk nanostructured Ni, Ti and Zr by repeated cold-rolling," Scripta Materialia, vol. 52, Issue 7, pp. 577-582 (2005).
Fernandez De La Mora, J. et al., "Generation of submicron monodisperse aerosols by electrosprays," Journal of Aerosol Science, vol. 21, Supplement 1, pp. S673-S676 (1990).
Gertsman, V. Y. et al., "Deformation behavior of ultrafine-grained materials," Materials Science Forum, vols. 225-227, pp. 739-744 (1996).
Gudmundson, Peter, "A unified treatment of strain gradient plasticity," Journal of the Mechanics and Physics of Solids, vol. 52, pp. 1379-1406 (2004).
Hentschel, T. et al., "Nanocrytsalline Ni-3.6 at.% P and its Transformation Sequence Studied by Atom-Probe Field-Ion Microscopy," Acta Materialia, vol. 48, pp. 933-941 (2000).
Jaworek, A., "Electrospray droplet sources for thin film deposition," Journal of Materials Science, vol. 42, Issue 1, pp. 266-297 (2007).
Kirchheim, Reiner, "Grain coarsening inhibited by solute segregation," Acta Materialia, vol. 50, pp. 413-419 (2002).
Kirchheim, Reiner, "Reducing grain boundary, dislocation line and vacancy formation energies by solute segregation II. Experimental evidence and consequences," Acta Materialia, vol. 55, pp. 5139-5148 (2007).
Kirchheim, Reiner, "Reducing grain boundary, dislocation line and vacancy formation energies by solute segregation. I. Theoretical backround," Acta Materialia, vol. 55, pp. 5129-5138 (2007).
Koch, C.C. et al., "Stabilization of nanocrystalline grain sizes by solute additions," Journal of Materials Science, vol. 13, Issue 23-24, pp. 7264-7272 (2008).
Koch, C.C. et al., "Ductility of Nanostructured Materials," Materials Research Society Bulletin, vol. 24, pp. 54-58 (1999).
Koch, C.C., "Synthesis of nanostructured materials by mechanical milling: problems and opportunities," Nanostructured Materials, vol. 9, Issues 1-8, pp. 13-22 (1997).
Lee, Z. et al., "Bimodal microstructure and deformation of cryomilled bulk nanocrystalline Al-7.5Mg alloy," Materials Science and Engineering A, vols. 410-411, pp. 462-467 (2005).
Legros, M. et al., "Microsample tensile testing of nanocrystalline metals," Philosophical Magazine A, vol. 80, No. 4, pp. 1017-1026 (2000).
Lloyd, D.J., "Particle reinforced aluminum and magnesium matrix composites," International Materials Reviews, vol. 39, Issue 1, pp. 1-23 (1994).
Luo, Jian et al., "The Role of a Bilayer Interfacial Phase on Liquid Metal Embrittlement," Science, vol. 333, Issue 3050, pp. 1730-1733 (2011).

(56) References Cited

OTHER PUBLICATIONS

Mayr, S.G. et al., "Stabilization of Cu nanostructures by grain boundary doping with Bi: Experiment versus molecular dynamics simulation," Physical Review B, vol. 76, p. 024111 (2007).
McCandlish L.E. et al., "Chemical processing of nanophase WC—Co composite powders," Materials Science and Technology, vol. 6, Issue 10, pp. 953-957 (1990).
Millett, Paul C. et al., "Stabilizing nanocrystalline materials with dopants," Acta Materialia, vol. 55, pp. 2329-2336 (2007).
Moon, Kyoung Il et al., "A study of the microstructure of nanocrystalline Al—Ti alloys synthesized by ball milling in a hydrogen atmosphere and hot extrusion," Journal of Alloys Compounds, vol. 291, pp. 312-321 (1999).
Mortensen, A. et al., "Metal Matrix Composites," Annual Review of Materials Research, vol. 40, pp. 243-270 (2010).
Nabarro, F.R.N., "The theory of solution hardening," The Philosophical Magazine: a Journal of Theoretical Experimental and Applied Physics, vol. 35, pp. 613-622 (1977).
Nan, C.W. et al., "The Influence of Particle Size and Particle Fracture on the Elastic/Plastic Deformation of Metal Matrix Composites," Acta Materialia, vol. 44, No. 9, pp. 3801-3811 (1996).
Perepezko, J.H., et al., "Amorphization and nanostructure synthesis in Al alloys", Intermetallics 10 (2002) p. 1079-1088.
Sanders, P.G. et al., "Elastic and Tensile Behavior of Nanocrystalline Copper and Palladium," Acta Materialia, vol. 45, No. 10, pp. 4019-4025 (1997).
Sanders, P.G. et al., "The strength of nanocrystalline metals with and without flaws," Materials Science Engineering A, vol. 234-236, pp. 77-82 (1997).
Scoville, N. et al., "Thermal Conductivity Reductions in SiGe via Addition of Nanophase Particles," Materials Research Society Symposium Proceedings, vol. 351, pp. 431-436 (1994).
Sekine, H. et al., "A combined microstructure strengthening analysis of SiC—p/Al metal matrix composites," Composites, vol. 26, pp. 183-188 (1995).
Taylor, Geoffrey, "Disintegration of water drops in an electric field," Proc. R. Soc. A, vol. 280, pp. 383-397 (1964).
Tsuji, N. et al., "Strength and ductility of ultrafine grained aluminum and iron produced by ARB and annealing," Scripta Materialia, vol. 47, pp. 893-899 (2002).
Valiev, R. Z. et al., "Bulk nanostructured materials from severe plastic deformation," Progress in Materials Science, vol. 45, pp. 103-189 (2000).
Valiev, R.Z. et al., "Producing Bulk Ultrafine-Grained Materials by Severe Plastic Deformation," Journal of Materials, vol. 58, Issue 4, p. 33 (2006).
Valiev, R.Z. et al., "Paradox of strength and ductility in metals processed by severe plastic deformation," Journal of Materials Research, vol. 17, No. 1, pp. 5-8 (2002).
Vanherpe, L. et al., "Pinning effect of spheroid second-phase particles on grain growth studied by three-dimensional phase-field simulations", Computational Materials Science 49 (2010) 340-350.
Wang, Y. et al.,"High tensile ductility in a nanostructured metal", Nature, 419 (2002), 912-915.
Wang, Y. M. et al., "Enhanced tensile ductility and toughness in nanostructured Cu," Applied Physics Letters, vol. 80, pp. 2395-2397 (2002).
Weertman, J.R. et al., "Structure and Mechanical Behavior of Bulk Nanocrystalline Materials," Materials Research Society Bulletin, vol. 24, pp. 44-50 (1999).
Weissmuller, J., "Alloy Effects in Nanostructures" Nanostructured Materials, vol. 3, pp. 261-272 (1993).
Xiao, T.D. et al., "Synthesis of Nanostructured Ni/Cr and Ni—Cr3C2 Powders by an Organic Solution Reaction Method," Nanostructured Materials, vol. 7, No. 8, pp. 857-871 (1996).
Xiao, T.D. et al., "Synthesis of Si(N,C) nanostructured powders from an organometallic aerosol using a hot-wall reactor," Journal of Materials Science, vol. 28, pp. 1334-1340 (1993).
Yamasaki, T. et al., "Formation of metal-TiN/TiC nanocomposite powders by mechanical alloying and their consolidation," Materials Science and Engineering A, vol. 350, pp. 168-172 (2003).
International Search Report and Written Opinion for PCT/US2021/021676, dated May 2021.
Office Action for U.S. Appl. No. 16/582,545 dated Nov. 30, 2021.
Office Action for U.S. Appl. No. 17/483,916 dated Nov. 23, 2021.
Updated List of Assignee Patents and/or Patent Applications of Assignee, Dec. 2021.
Olawole, O.C. et al., "Theoretical studies of thermionic conversion of solar energy with graphene as emitter and collector," Journal of Photonics for Energy, vol. 8(1), p. 018001 (2018).
Sindhuja, M. et al., "High Efficiency Graphene Coated Copper Based Thermocells Connected in Series," Frontiers in Physics, vol. 6, Article 35 (2018).
Updated List of Assignee Patents and/or Patent Applications of Assignee, May 2022.
International Search Report PCT/US2021/050831, dated Jan. 7, 2022.
Provisional Written Opinion PCT/US2021/050831, dated Jan. 7, 2022.
Campbell, Matthew F., et al., "Progress Toward High Power Output in Thermionic Energy Converters", Advanced Science, vol. 8, No. 9, May 1, 2021.
Prieto Rojas, J. et al., "Folding and Stretching a Thermoelectric Generator," Proceedings of the Society of Photo-Optical Instrumentation Engineers, vol. 10639, p. 10639E (2018).
International Search Report for PCT/US2020/052506, dated Dec. 2020.
International Search Report for PCT/US2020/052507, dated Dec. 2020.
International Search Report for PCT/US2020/052508, dated Dec. 2020.
Office Action, U.S. Appl. No. 17/003,266, dated Jul. 27, 2022.
Office Action, U.S. Appl. No. 16/906,508, dated Jul. 21, 2022.
Office Action, U.S. Appl. No. 16/416,858, dated Jul. 20, 2022.
Office Action, U.S. Appl. No. 17/407,450, dated Aug. 3, 2022.

\* cited by examiner

SINGLE ELECTRON TRANSISTOR (SET), CIRCUIT CONTAINING SET AND ENERGY HARVESTING DEVICE, AND FABRICATION METHOD

BACKGROUND

The present embodiments relate to a Single Electrode Transistor (SET), a related fabrication method, and assemblies and circuits including the same.

Semiconductor fabrication processes have evolved dramatically over the last few decades. The evolution in fabrication processes has enabled production of micron-scale electronic transistors. Microfabrication processes have largely been based on photolithography as a patterning tool with resolvable critical dimensions above 10 microns at inception and arriving at close to 10 nanometers today. Advances in photolithography have been a significant driver for decreasing cost and increasing performance of transistors such as conventional Field Effect Transistors (FETs). However, reduced dimensions are associated with technical difficulties. For example, a reduction in dimensions is accompanied by an increase in current density, thereby placing an increased heat burden on the FETs.

Single Electron Transistors (SETs) function similar in principle to FETs and follow similar design rules, with some significant differences. Whereas a FET operates using a flow of a large number of electrons, a SET depends on a single electron flow, that is, electrons flowing one after another, through nanometer-size conductive particles. Generally, a conventional SET includes two reservoirs, i.e., one for electrons and one for holes, and a metal or semiconducting "island" interposed between and spaced apart from the reservoirs. The island is also known as a quantum island or quantum dot, and has a size of about several nanometers to about several tens of nanometers. For brevity, the disclosure will use the term quantum island hereinafter. A single electron may enter and exit the quantum island by a single electron charging effect, such as adjusting a voltage applied to an operatively coupled transistor. In this manner, an on-state and an off-state may be generated. Control over those states allows the SET to act as a switch. The single electron flow imparts a reduced heat burden and reduced power consumption compared to the multi-electron flow that characterizes FETs. Consequently, in principle, compiled 3-D SET chips should be smaller and more stackable than silicon photolithography-produced chips without the heat burden that accompanies the use of FETs.

However, SETs, and in particular the quantum islands of SETs, are difficult to replicate consistently and at adequate processing rates using conventional photolithography techniques. Further, most photolithography techniques produce semiconductors that may experience quantum effects interference with their functionality in the several nanometer range, e.g., in the case of a quantum island of about 7 nm diameter or smaller. Electron-beam lithography may permit for relatively precise nanoscale transistor production, but the technique is expensive, cumbersome, and requires high vacuum. Further, bridging the gap between source and drain electrodes and the quantum islands from about 30 nm down to a molecular scale is difficult with electron-beam lithography. (Darling, 2011).

Attempts have been made to incorporate conventional inkjet deposition (e.g., printing) techniques into manufacturing processes for Printed Integrated Circuits (PIC s). However, those conventional inkjet printing techniques are not suitable for the formation of SETs. Inkjet-printed materials, mainly organic materials such as polymers and small molecules, limit performance and applicability of the resulting electronics. For example, inkjet printing of SETs can lead to poor resolution due to the formation of "satellite droplets" during printing. The satellite droplets impair precision and accuracy of the printing and operation of the SETs. Further, conventional inkjet-printed electronics have characteristic dimensions in the micron range, such as for example 1 micron to 10 microns. The resulting circuits are relatively large, at least in comparison to advanced photolithography produced electronics and the desired dimensions for SETs. In particular, these organic materials have low carrier mobility ($\sim 10^{-2}$ $cm^2/V/sec$ in P3HT) yielding Thin Film Transistors (TFTs) useful only in low-speed, low-density applications like displays and Radio Frequency Identification (RFID). These materials also suffer generally from substantial performance degradation when exposed to ambient environments rendering them unsuitable for many electronic applications.

SUMMARY

Embodiments disclosed herein include methods, devices, assemblies, subassemblies, apparatus, transistors, and circuits.

In an aspect, a method for fabricating a single electron transistor is provided. The method involves providing a substrate with a substantially planar surface and a source electrode, a drain electrode, and a gate electrode on the substantially planar surface of the substrate, with the source and drain electrodes separated from one another by a gap. The source electrode and the drain electrode are electrified, and a single nanometer-scale conductive particle is electrospray deposited in the gap between the electrified source electrode and the drain electrode. The single nanometer-scale conductive particle has an effective size of not greater than 10 nanometers. At least one carbon nanotube is deposited on the substrate. The at least one carbon nanotube is subject to dielectrophoresis to position the at least one carbon nanotube within 1 nanometer of the single nanometer-scale conductive particle. The at least one carbon nanotube establishes a first connection between the source electrode and the single nanometer-scale conductive particle and a second connection between the drain electrode and the single nanometer-scale conductive particle.

In another aspect, a single electron transistor (SET) is provided. The SET includes a substrate with a substantially planar surface and a source electrode, a drain electrode, and a gate electrode on the substantially planar surface of the substrate by a gap, with the source electrode and the gate electrode spaced apart from one another by a gap. A single nanometer-scale conductive particle is electrospray deposited in the gap between the electrified source electrode and the drain electrode. The single nanometer-scale conductive particle has an effective size of not greater than 10 nanometers. At least one carbon nanotube is positioned within 1 nanometer of the single nanometer-scale conductive particle and establishes a first connection between the source electrode and the single nanometer-scale conductive particle and a second connection between the drain electrode and the single nanometer-scale conductive particle.

In still another aspect, a circuit is provided that includes one or more power sources electrically connected to a single electron transistor. The SET includes a substrate and a source electrode, a drain electrode, and a gate electrode on a substantially planar surface of the substrate, with the source and drain electrodes spaced apart from one another by a gap. A single nanometer-scale conductive particle is electrospray deposited in the gap between the electrified source electrode and the drain electrode. The single nanometer-scale conductive particle has an effective size of not greater than 10 nanometers. At least one carbon nanotube is positioned within 1 nanometer of the single nanometer-scale conductive particle and establishes a first connection between the source electrode and the single nanometer-scale conductive particle and a second connection between the drain electrode and the single nanometer-scale conductive particle. At least one of the one or more power sources comprises an energy harvesting device including a first electrode, a second electrode spaced from the first electrode to provide an inter-electrode gap between the first and second electrodes, and a plurality of nanoparticles suspended in a medium contained in the inter-electrode gap and arranged to permit electron transfer between the first and second electrodes.

These and other features and advantages will become apparent from the following detailed description of the presently exemplary embodiment(s), taken in conjunction with the accompanying drawings.

BRIEF DESCRIPTION OF THE SEVERAL VIEWS OF THE DRAWINGS

The drawings referenced herein form a part of the specification and are incorporated herein by reference. Features shown in the drawings are meant as illustrative of only some embodiments, and not of all embodiments, unless otherwise explicitly indicated.

DETAILED DESCRIPTION OF EXEMPLARY EMBODIMENTS

It will be readily understood that the components and features of the exemplary embodiments, as generally described herein and illustrated in the Figures, may be arranged and designed in a wide variety of different configurations. Thus, the following detailed description of the embodiments of the methods, devices, assemblies, apparatus, etc. of the exemplary embodiments, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment. The embodiments may be combined with one another in various combinations.

The illustrated embodiments will be best understood by reference to the drawings, wherein like parts are designated by like numerals throughout. The following description is intended only by way of example, and simply illustrates certain selected embodiments of methods, devices, circuits, assemblies, apparatus, etc. that are consistent with the embodiments as claimed herein.

Figure 1:
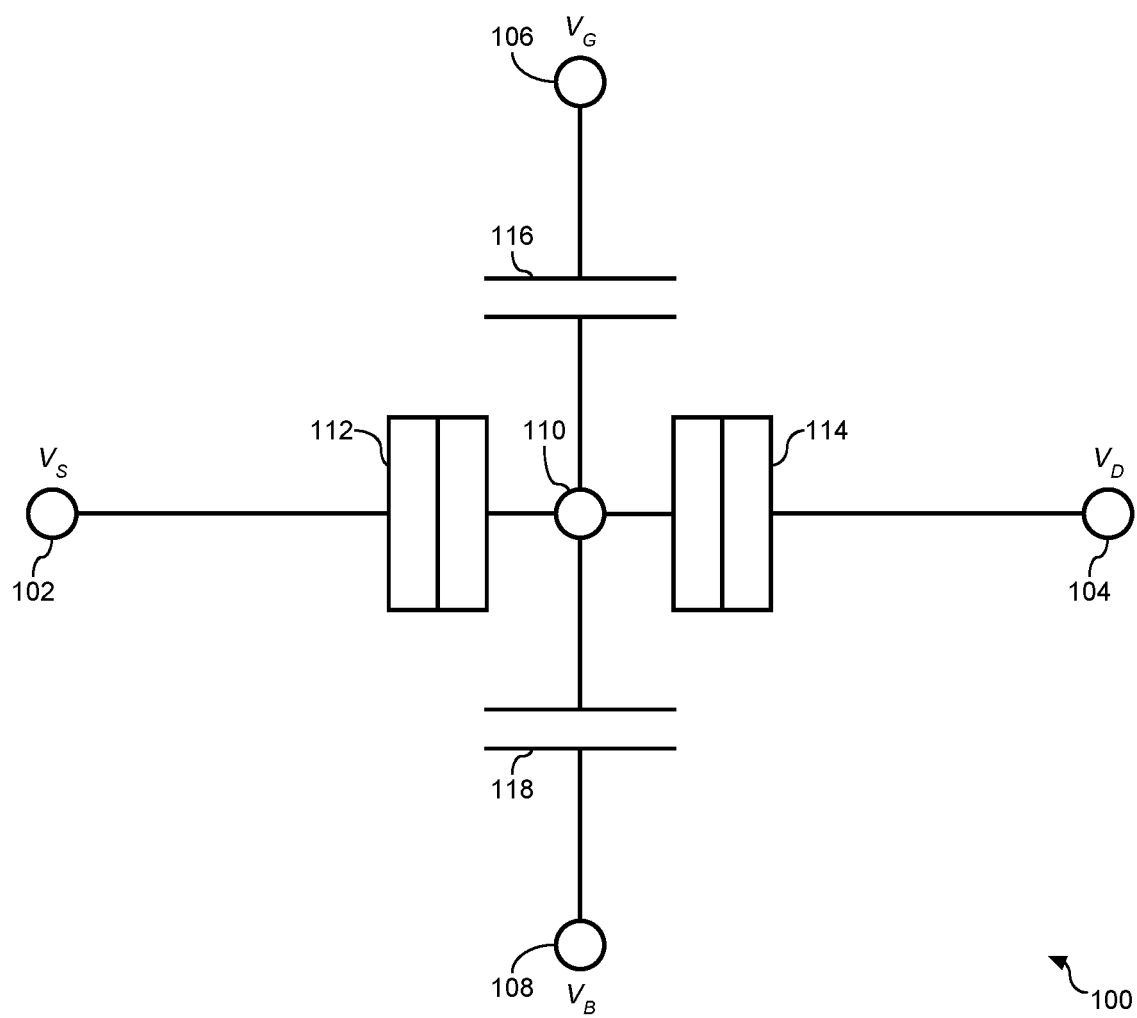
FIG. 1 is a schematic of a circuit including a single electron transistor according to an exemplary embodiment.

FIG. 1 is a schematic fragmented view of circuit diagram including a single electron transistor ("SET"). The circuit diagram, generally designated by reference numeral (100) in FIG. 1, includes a source electrode (102) having a voltage $V_S$, a drain electrode (104) having a voltage $V_D$, a gate electrode (106) having a voltage $V_G$, and a backgate electrode having a voltage $V_B$ (108).

A quantum island (also referred to in embodiments as a quantum dot) (110) is shown in the center of the circuit diagram (100). Positioned between the source electrode (102) and the quantum island (110) is a first junction (112), and positioned between the drain electrode (104) and the quantum island (110) is a second junction (114). The gate electrode (106) is capacitively coupled to the quantum island (110), as represented in FIG. 1 by capacitor (116). The backgate (108) is also capacitively coupled to the quantum island (110), as represented by capacitor (118).

Figure 2:
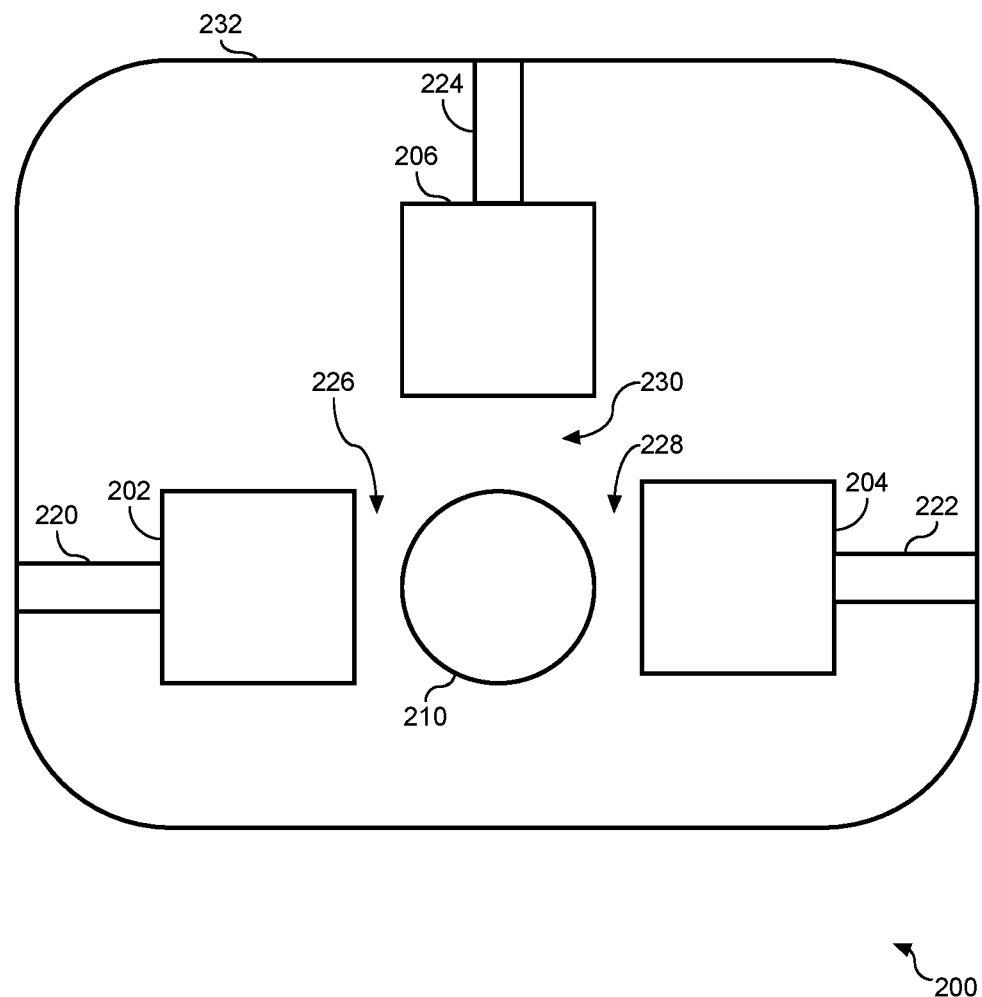
FIG. 2 is an enlarged, fragmented plan review of another single electron transistor of an exemplary embodiment.

FIG. 2 is an enlarged, fragmented schematic diagram of a single electron transistor (SET) (200) similar to the single electron transistor of the circuit (100) of FIG. 1, but omitting the backgate electrode (108) of FIG. 1. The single electron transistor (200) includes a source electrode (202) and a drain electrode (204) spaced apart from one another by a gap, with a quantum island (210) positioned within the gap between and spaced from the source electrode (202) and the drain electrode (204). The SET (200) is located on a surface of a substrate (also referred to as a wafer) (232).

Conductive traces (or lines) (220), (222), and (224) are electrically connected to the source electrode (202), the drain electrode (204), and the gate electrode (206), respectively. Although not shown, if a backgate electrode was present, as in FIG. 1, a corresponding trace would be provided for the backgate electrode in FIG. 2. The conductive traces (220), (222), and (224) serve to transport electrons to and from the electrodes (202), (204), and (206), respectively, in exemplary embodiments without requiring sintering of the conductive traces.

In FIG. 2, the source electrode (202) is separated from the quantum island (210) by a first space (226) of a first distance, and the drain electrode (204) is separated from the quantum island (210) by a second space (228) of a second distance. The first and second spaces (226) and (228), respectively, are positioned diametrically opposite to one another. The first distance of the first space (226) may be equal to or different than the second distance of the second space (228). The first and second distances may be in a range of, for example, about 1 nanometer to about 4 nanometers. The gate electrode (206) is likewise separated by a third space (230) from the quantum island (210). The third distance representing the third space (230) between the gate electrode (206) and the quantum island (210) may be in a range of, for example, about 1 nanometer to about 4 nanometers.

In an exemplary embodiment, the gate electrode (206) is positioned approximately ninety degrees from the source electrode (202) and the drain electrode (204). In an exemplary embodiment, the gate electrode (206) is co-planar with the source electrode (202) and the drain electrode (204).

Operation of SETs is based on the Coulomb blockade effect. Electrons pass between the source electrode (102), (202) and the drain electrode (104), (204) one-by-one onto and off of the quantum island (110), (210). Electrons lack sufficient energy to transfer between the either the source electrode (102), (104) or the drain electrode (104), (204) and the quantum island (110), (210) when the gate voltage and the bias voltage (between the source and the drain electrodes) are zero. When the energy of the system reaches the Coulomb energy, e.g., by increasing the bias voltage, an electron transfers between the source electrode (102), (202) and the quantum island (110), (210), then the quantum island (110), (210) and the drain electrode (104), (204). The Coulomb blockage is lifted by the increased voltage to allow electron travel through the island (110), (210). The Coulomb energy, $E_c$, is given by Equation (1) below:

$$E_c = e^2/2C \quad \text{Equation (1)}$$

wherein e is the charge on an electron, and C is the total capacitance of the source and drain junctions and the gate electrode, which the quantum island (110), (210) is capacitively coupled to.

The Coulomb gap voltage, e/C, is the voltage necessary to lift the blockade and transfer an electron across the spaces (226) and (228) to and from the quantum island (110), (210). When the bias voltage between the source electrode (102), (202) and the drain electrode (104), (204) is greater than the Coulomb gap voltage, electrons actively travel across the spaces (226) and (228) one-by-one resulting in a current through the transistor independent of the gate bias. In operation according to an embodiment, the bias voltage between the source and drain electrode is maintained below the Coulomb gap voltage, and the Coulomb blockage effect, and hence the electron transfer across the spaces (226) and (228), is controlled by altering the gate voltage.

In order to see the quantization of the electron flow (known as the Coulomb staircase), the thermal energy is less than the Coulomb gap voltage. For a SET to operate at room temperature, $kT \ll e^2/2C$, which translates into the capacitance $C \ll e^2/2kT \sim 3.09 \times 10^{-18}$ F. The capacitance (CNP) of a sphere is $C=q/V$ where q is total charge and $V=q/4\pi\varepsilon_o r$, where $\varepsilon_o$ is the permittivity of free space, and r is the radius of the nanoparticle. Substituting for the voltage, V, and solving for the capacitance, results in $C=4\pi\varepsilon_o r$ that is less than $3 \times 10^{-18}$ F. Accounting for the uniform monolayer (of dielectric constant ε) on a spherical nanoparticle, the capacitance can be expressed as $CNP=ANP\varepsilon_o\varepsilon (r+d)/rd$ where ANP is the surface area if a sphere ($4\pi r^2$), and d is the thickness of conductive coating (0.5 nm). Substituting for the surface area of the sphere results in the equation $CNP=4\pi\varepsilon\varepsilon_o r(r+d)/d$. The coated nanoparticles have a capacitance of less than $0.6 \times 10^{-18}$ F which enables operating temperatures substantially above room temperature. Thus, in an embodiment a 1 nm SET (wherein the 1 nm is the characteristic dimension of the smallest working features, e.g., the island) avoids thermally-induced random tunneling events and operates at elevated temperatures.

Figure 3:
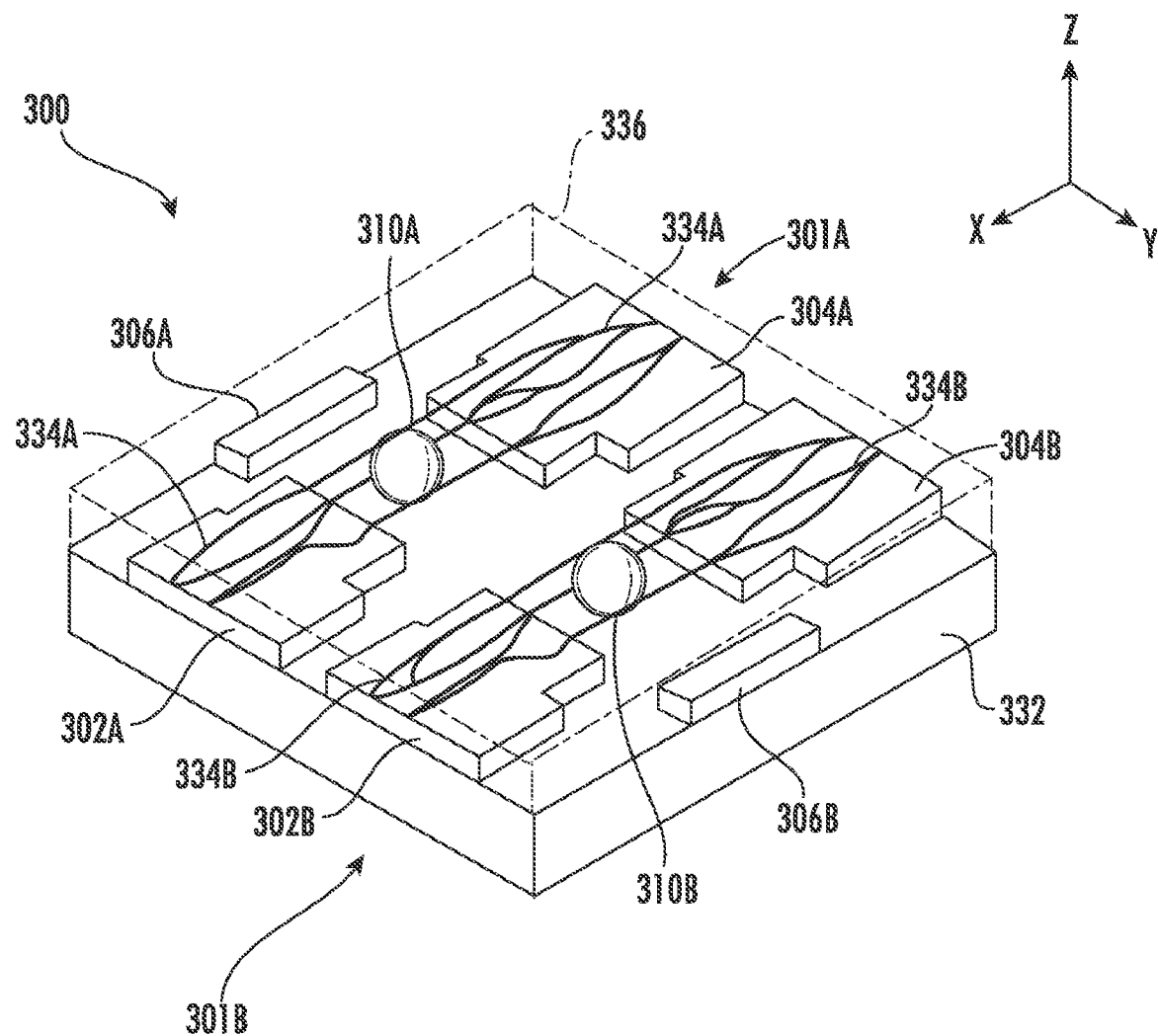
FIG. 3 is a fragmented, perspective view of a plurality of single electron transistors on a common substrate according to another embodiment.

FIG. 3 is an enlarged, fragmented perspective view of a chip (300) including a pair of single electron transistors (SETs) (301A) and (301B) on a substantially planar surface of a substrate (also known as a wafer) (332). While only a pair of SETS (301A) and (301B) are illustrated on the substantially planar surface of the substrate (332) in FIG. 3, it should be understood that in embodiments the substrate (332) accommodates one or more SETs, including tens of SETs, hundreds of SETs, or thousands of SETs.

The first SET (301A) includes a first source electrode (302A), a first drain electrode (304A), and a first quantum island (310A) positioned between and spaced from the first source electrode (302A) and the first drain electrode (304A). The first SET (301A) further includes a first gate electrode (306A) positioned perpendicular or relatively perpendicular from the first source and drain electrodes (302A) and (304A). The first SET (301A) includes one or more first nanoscale connections (334A) between the first source electrode (302A) and the first quantum island (310A) and between the first quantum island (310A) and the first drain electrode (304A).

Similarly, the second SET (301B) includes a second source electrode (302B), a second drain electrode (304B), and a second quantum island (310B) positioned between and spaced from the second source electrode (302B) and the second drain electrode (304B). The second SET (301B) further includes a second gate electrode (306B) positioned perpendicular or relatively perpendicular from the second source and drain electrodes, (302B) and (304B), respectively. The second SET (301B) includes second nanoscale connections (334B) between the second source electrode (302B) and the second quantum island (310B) and between the second quantum island (310B) and the second drain electrode (304B).

The one or more nanoscale connectors (334A) establish a first connection or junction between the first source electrode (302A) and the first quantum island (310A) embodied as a single nanometer-scale conductive particle and a second connection or junction between the first drain electrode (304A) and the second quantum island (310A) embodied as a single nanometer-scale conductive particle. In an embodiment, one or more of the nanoscale connectors (334A) extend lengthwise continuously between the first source electrode (302A) and the first drain electrode (304A), coming within 1 nanometer of, and in a particularly exemplary embodiment coming into contact with, the first quantum island (310A). In another exemplary embodiment, one or more first nanoscale connectors extend from the first source electrode (302A) to the quantum island (310A), and one or more different second nanoscale connectors extend from the first drain electrode (304A) to the first quantum island (310A).

Likewise, one or more nanoscale connectors (334B) establish a third connection or junction between the second source electrode (302B) and the second quantum island (310B) embodied as a single nanometer-scale conductive particle and a fourth connection or junction between the second drain electrode (304B) and the second quantum island (310B) embodied as a single nanometer-scale conductive particle. In an embodiment, one or more of the nanoscale connectors (334B) extend lengthwise continuously between the second source electrode (302B) and the second drain electrode (304B), coming within 1 nanometer of, and in a particularly exemplary embodiment coming into contact with, the second quantum island (310B). In another exemplary embodiment, one or more third nanoscale connectors extend from the second source electrode (302B) to the second quantum island (310B), and one or more different fourth nanoscale connectors extend from the second drain electrode (304B) to the second quantum island (310B).

Although nanoscale connectors (e.g., (334A, 334B)) are not illustrated in the embodiments of FIGS. 1 and 2, it should be understood that those embodiments may include such nanoscale connectors, such as one or more carbon nanotubes, single wall carbon nanotubes, etc.

The chip (300) includes an encapsulate (336), shown in phantom in FIG. 3 so as not to block viewing of the underlying structures and components. The encapsulate (336) encloses the nanoelectronic components, including the electrodes, traces, conductive particles, nanoscale connectors, etc.

Representative materials for the chip (300) and its various components are discussed below. The same materials may be used for the embodiments illustrated in FIGS. 1 and 2.

In an exemplary embodiment, the substrate (or wafer) (332) is made of an inert, dielectric material, especially but not limited to glossy polymers. Representative, non-limiting materials that may be used for the substrate include, for example, epoxies, ceramic nano-particle-filled resins (e.g., Grandio™), silica nanoparticle-reinforced epoxies (e.g., Futura Bond™) polydimethylsiloxane (PDMS), polymethylmethacrylate (PMMA), polymethacrylate (PMA), polyvinylalcohol (PVA), polyvinylchloride (PVC), polyacrylic acid (PAA), Mercon™, phenyl-C61-butyric acid methyl ester (PCBM), pentacene, carbazoles, phthalocyanine, and aerogels, such as silica, aluminum, chromia, graphene oxide, and tin oxide aerogels. In an exemplary embodiment, the substrate (332) is not made of (i.e., is free of) a semiconductor material, such as silicon, gallium, arsine, carbides, etc.

In an exemplary embodiment, the surface of the substrate (332) is hydrophobic. For example, inherently hydrophobic materials such as PDMS may be selected as the substrate (332) to provide the hydrophobic surface. In another embodiment, the surface of a non-hydrophobic (hydrophilic) substrate (332) may be treated, such as with plasma, to render the surface hydrophobic.

The source electrodes (302A), (302B), the drain electrodes (304A), (304B), the gate electrodes (306A), (306B), the backgate electrode (not shown in FIG. 3 but represented in FIG. 1 by reference numeral (108)), and the traces (not shown in FIG. 3, but represented in FIG. 2 by reference numerals (220), (222), and (224)) may be made of the same material as one another or may be made of different materials. According to an exemplary embodiment, the electrodes (302A), (302B), (304A), (304B), (306A), and (306B) and the traces are comprised of a conductive material, and in particularly exemplary embodiments, a metal, a combination of metals, and/or graphene. Representative metals include, by way of example, gold, silver, copper, and combinations including one or more of the same. The electrodes (302A), (302B), (304A), (304B), (306A), and (306B) and/or traces may be deposited by using conductive inks, as described in further detail below in connection with FIG. 6.

In an exemplary embodiment, the quantum islands (310A), (310B) are comprised of a conductive material, such as a metal, including, for example, gold, silver, and/or copper, or a conductive non-metal, such as graphene or an alkanethiol. In another exemplary embodiment, the quantum islands (310A), (310B) each comprise a substantially non-conductive core with a conductive coating. The core shape may be that of a sphere, for example. An exemplary core material is polystyrene latex (PSL). Suitable conductive coatings include, for example, gold, silver, copper, and/or graphene.

In an exemplary embodiment, any one or more of the electrodes (302A), (302B), (304A), (304B), (306A), and (306B) (as well as backgate electrode if present (see (108) in FIG. 1), the traces (see (220), (222), and (224) in FIG. 2), and the first and second nanometer-scale conductive particles (310A) and (310B) are covalently bonded to the substrate (332) without the need for sintering. One benefit of the covalent bond of an exemplary embodiment is that as the substrate (332) lengthens or stretches in use, the nanocomponents covalently bonded thereto lengthen or stretch with the substrate. Such expansion or stretch can result from physical manipulation of the substrate (332) or environmentally induced (e.g., temperature) changes.

In an exemplary embodiment the nanoscale connectors (334A) and (334B) each comprise one or more conductive carbon nanotubes (CNT), and in an exemplary embodiment the connectors (334A) and (334B) are conductive Single Wall Carbon Nanotubes (SWCNTs). Commercial suppliers of SWCNTs include U.S. Research Nanomaterials, although the SWCNTs that may be used in connection with the embodiments described herein are not limited to SWCNTs supplied by that commercial supplier.

Representative encapsulates (336) include aerogels, such as silica, alumina, chromia, graphene oxide, and tin oxide aerogels.

Representative dimensions for the chip (300) and its various components are discussed below. The same dimensions may be used for the embodiments illustrated in FIGS. 1 and 2.

The size of the substrate (or wafer) (332) is not particularly limited. According to an exemplary embodiment, the substrate (332) has a thickness (in the z-direction in FIG. 3) in a range of, for example, 1 nanometer to 10 microns. According to exemplary embodiments, the surface of the substrate (332) is substantially planar. In exemplary embodiments, the surface of the substrate (332) has a variability of not greater than 5 nanometers, or not greater than 1 nanometer, as measured by a profilometer.

The electrodes (302A), (302B), (304A), (304B), (306A), and (306B) (as well as backgate electrodes if present (see (108) in FIG. 1) and the traces (see (220), (222), and (224) in FIG. 2) generally have a thickness (in the z-direction) of 1 nm to 10 nm.

In an exemplary embodiment, the quantum islands (310A), (310B) are each a single nanometer-scale conductive particle (or nanoparticle). According to an exemplary embodiment, the single nanometer-scale conductive particle has an effective size of not greater than 10 nanometers, such as in a range of about 1 nanometer to about 10 nanometers, or in a range of about 1 nanometer to about 5 nanometers. In another embodiment, the single nanometer-scale conductive particle is less than 1 nanometer. The effective size is the largest dimension of the nanoparticle. In the event that the single nanometer-scale conductive particle is a sphere, for example, the effective size will be the diameter of the spherical particle.

In exemplary embodiments, the nanoscale connectors (e.g., SWCNTs) have lengths in a range of 10 to 100 nanometers. In an additional exemplary embodiment, the nanoscale connectors (e.g., SWCNTs) have a diameter of about 1 nanometer.

In an exemplary embodiment, the encapsulate (336) has a thickness in a range of 10 nanometers (nm) to 100 nanometers.

Figure 4A:
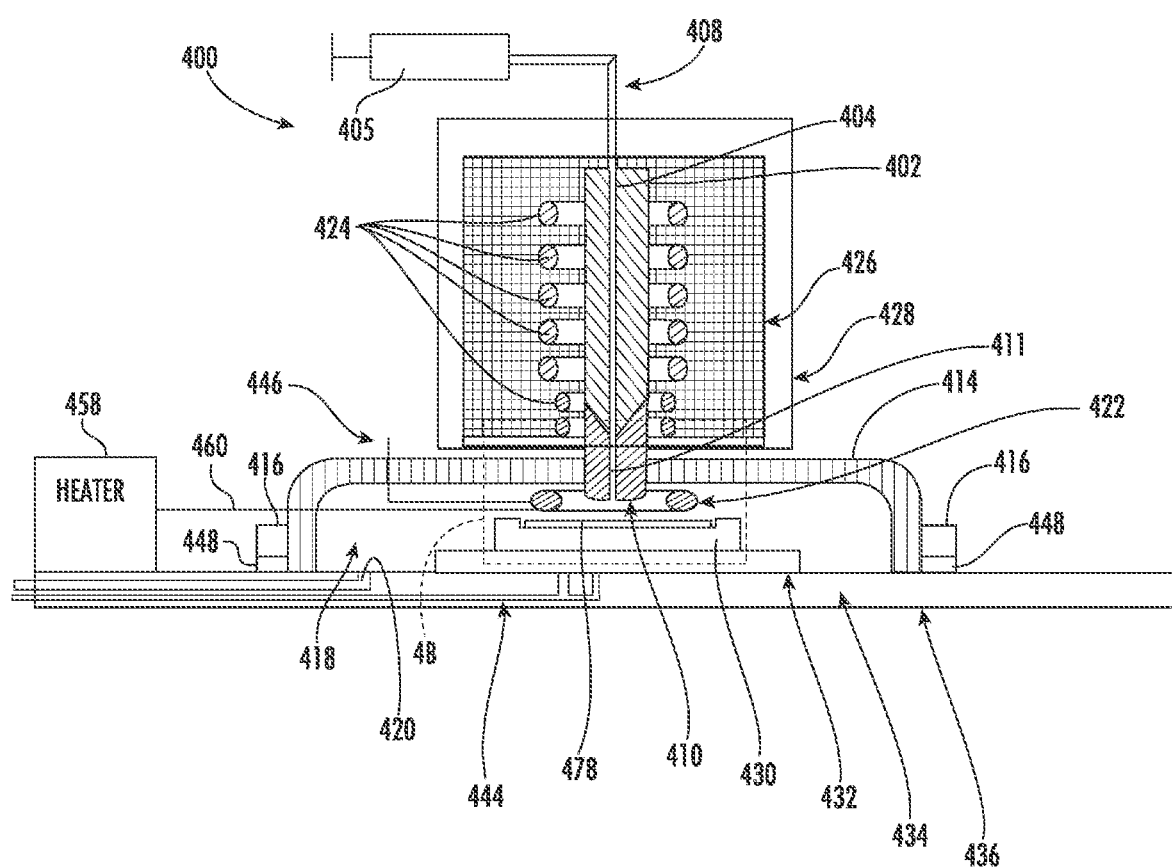
FIG. 4A is a side sectional view of an electrospray apparatus suitable for making a single-electron transistor and other structures, including an energy harvesting device, described herein in accordance with an embodiment.

FIG. 4A shows the major components of an electrospray apparatus (400) in accordance with an exemplary embodiment for making SETs and assemblies, devices, and circuits containing SETs. Examples of nanoelectronic structures that may be made using the electrospray apparatus (400) include resistors, capacitors, inductors, transformers, diodes, integrated circuits, etc. The electrospray apparatus (400) (or (500) below) described herein may be used to carry out an Electrical Mobility Aerosol Focusing (EMAF) technique, as described in greater detail below.

The electrospray apparatus (400) has capillary needle (402) with a central passage (404) through which liquid material is received from a syringe pump (405) via a conduit (408) that communicates with the top of the capillary needle (402). In an embodiment, induction heating coils (424) wrap around the capillary needle (402), serving to heat the liquid material (404). Fewer or more induction heating coils (424) than shown may be used, or the induction heating coils may be eliminated. A Faraday cage (426) around the capillary needle (402) and the induction heating coils (424) shield the environment from electromagnetic radiation generated by the induction heating coils (424). A vented heat shield (428) positioned outside the Faraday cage (426) performs a similar shielding function with respect to heat generated by the induction heating coils (424).

An electrospray nozzle or print head (referred to hereinafter as a print head in the interest of brevity) (410) is coupled to the bottom of the capillary needle (402) to receive the liquid material (not shown) from the capillary needle (402) with a capillary tube (411). While the capillary needle (402) and the capillary tube (411) are shown as separate but communicating structures, alternatively, the capillary tube (411) may form part of the capillary needle (402). The capillary tube (411) is configured for transporting the liquid material out of the capillary needle (402) to the print head (410).

In an exemplary embodiment, the print head (410) comprises an ultrafine conductive hollow needle to concentrate electric fields around its outlet orifice. The orifice opening can be selected from several hundred nanometers to a few microns, such as 100 nm to 10,000 nm, depending upon the material to be deposited.

An extractor electrode (422) is coupled to the print head (410). As shown in FIG. 4A, the extractor electrode (422) is positioned near or at the bottom of the print head (410) where the capillary tube (411) exits. The extractor electrode (422) is configured for generating an electrical field that extracts the liquid material from the print head (410) to form a stream of nanoparticle-size droplets. The electric field also drives the droplets toward a moving stage (436).

Additionally, the extractor electrode (422) also generates a magnetic field in an exemplary embodiment. The generated magnetic field can serve to limit dispersion of the stream of droplets. When discharged from the print head (410), the electrosprayed droplets are charged. The charge tends to disperse the droplets from one another. More specifically, the charge imparts a force on the particles that is orthogonal to both the magnetic field lines and the motion of the charged particles. If the magnetic field is strong relative to the velocity of the charged particle, however, the charge particles will tend to orbit magnetic field lines while moving along the lines. Thus, the dispersive tendencies of the stream of charged droplets are countered by the magnetic field.

The extractor electrode (422) is shaped to provide both the electric field and magnetic field with characteristics useful for extracting liquid material from the electrospray nozzle (410), driving the stream of droplets (456) toward to the moving stage (436), and focusing the stream of droplets (456) on a deposition area (452) (see FIG. 4B) on the moving stage (436). In an exemplary embodiment, the extractor electrode (422) has a toroidal shape with the center of the toroid penetrated by the print head (410). In an embodiment, the extractor electrode (422) comprises one or more turns of wire. The more turns, the greater the magnetic field generated for a given current. Extractor electrode wiring (446) provides electrical current to the extractor electrode (422). In an exemplary embodiment, a high voltage direct current power supply is used. In another exemplary embodiment, an alternating current power supply is used at, for example, a frequency of up to 1 GHz, or a frequency up to 1 MHz.

As previously mentioned, the deposition area (452) of the moving stage (436) serves as the target for the stream of droplets (456). In an embodiment, the moving stage (436) is configured for moving relative to the print head (410) in three orthogonal dimensions. In an embodiment, the moving stage (436) is a piezo-flexure guided stage providing bidirectional repeatability on a nanometer scale. The moving stage (436) is typically electrically grounded so that the moving stage (436) forms a planar endpoint for the electrical field. In an exemplary embodiment, the moving stage (436) comprises a utility base plate (434), a cooling chuck (432) and an object holder (430) having the previously mentioned deposition area (452) on an upward facing surface of the object holder (430). The object holder (430) is configured for providing a surface for the fabrication of an object (478) that results from the electrospray process, and more particularly the EMAF technique. The cooling chuck (432) is positioned underneath the object holder (430) and coupled thereto. The cooling chuck (432) is configured for cooling the object holder (430), typically with one or more thermoelectric cooling chips that use, for example, DC current to pump heat from the object holder (430) to the utility base plate (434). The utility base plate (434) is exposed to ambient air and may be cooled with natural convection or forced air flow. The utility base plate (434) has wiring (444) for powering the cooling chuck (432) and for any sensors that may be embedded in the object holder (430). The utility base plate (434) has an enclosure gas inlet (420) to inject gases into the enclosure cavity (418). Example gases include inert gases such as nitrogen, argon, and the like.

The exemplary electrospray apparatus (400) has an enclosure (414) coupled to the print head (410) and the capillary needle (402). In the exemplary embodiment, the enclosure (414) is made of quartz, but other suitable materials may be used. The enclosure (414) is shaped such that when placed in contact with the moving stage (436), the enclosure (414) and moving stage (436) collectively define an enclosure cavity (418) that serves as a controlled environment for the electrospray process. The enclosure (414) has an enclosure floating frame (416) that is slidingly coupled to the outer edges of the central part of the enclosure (414). The enclosure floating frame (416) maintains contact with the moving stage (436) as the moving stage (436) moves vertically over short distances and horizontally with respect to the enclosure (414) and floating frame (416). Maintaining contact between the enclosure floating frame (416) and the moving stage (436) keeps the enclosure cavity (418) fully enclosed during electrospray object fabrication. An enclosure gasket (448) on the bottom of the enclosure floating frame (416) improves the seal of the enclosure cavity (418) and allows the moving stage (436) to move laterally without breaking the seal. In the exemplary embodiment, the enclosure gasket (448) is made of felt, but in other embodiments may be made of other suitable materials, including but not limited to those typically used for gaskets.

Figure 4B:
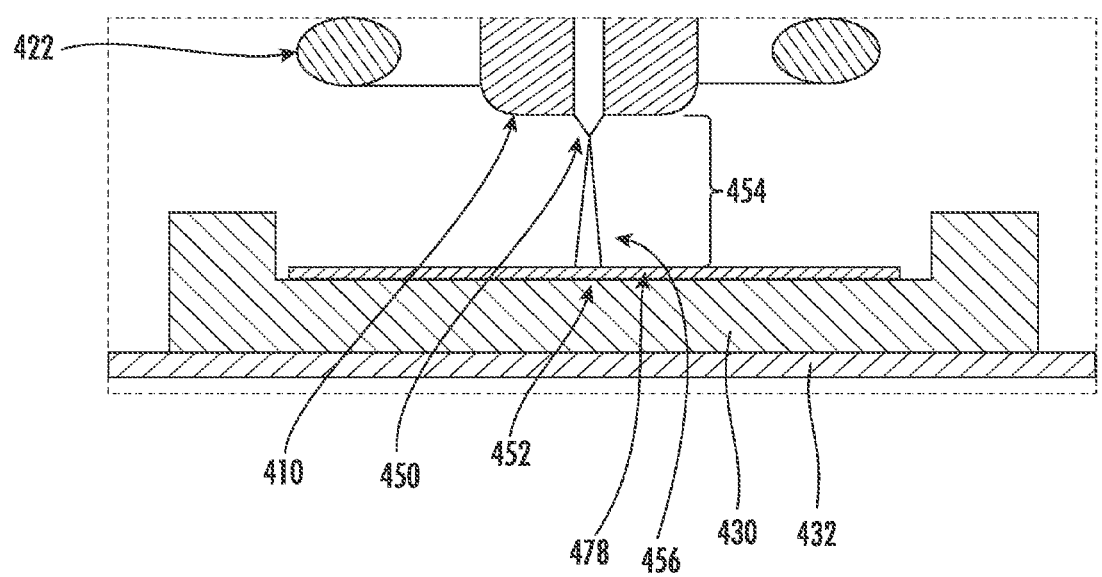
FIG. 4B is an expanded view of the area delineated by broken-line box 4B of FIG. 4A.

FIG. 4B shows an enlarged view of the area delineated by broken-line box 4B of FIG. 4A around the print head (410) and object holder (430) in an exemplary embodiment of the electrospray apparatus (400). Some details are not shown in FIG. 4B to more clearly present other details. In the exemplary embodiment, the flow rate of the liquid material from the capillary needle (402) is controlled, at least in part, by the syringe pump (405). Other factors affecting flow rate include electrical conditions (e.g., voltage, current frequency, waveform), fluid properties such as conductivity, and surface tension.

In exemplary embodiments, an Electrical Mobility Aerosol Focusing (EMAF) technique is employed for electrospraying. According to this EMAF technique, charged nanoparticles in aerosolized droplets discharged from the print head (410) are guided by a precise position by a concentrated electromagnetic field generated by the extractor electrode (422).

In an embodiment for carrying out the EMAF technique, a stream of droplets (456) emerges from a Taylor cone (450) that forms on the tip of the print head (410) when the electric field draws the liquid material in the aerosol from the print head (410). Dispersion of the stream of droplets (456) is limited by the magnetic field. A region on the fabricated object (478) where the stream of droplets (456) impacts is referred to as the deposition area (452). In an embodiment, the fabricated object (478) comprises successive deposition layers. In another embodiment, the fabricated object (478) comprises a single deposition layer. In yet another embodiment, the fabricated object (478) comprises single-layer structures and multi-layer structures. In another embodiment, a pre-formed substrate or wafer (such as (332)) is positioned on the object holder (430) prior to electrospraying. In still another embodiment, the substrate or wafer (such as (332)) is fabricated on the object holder (430), and constitutes the deposition area (452) for deposition of electrodes, traces, quantum islands, and any other features of the SETs and related circuits.

The moving stage (436) moves laterally while the stream of droplets (456) impacts on the fabricated object (478) (or object holder (430)), forming the current deposition layer over all or part of the deposition area (452), be it previous deposition layers or the object holder (430). The distance between the print head (410) and the deposition area (452) is referred to as the stand-off distance (454) or distance-to-deposition. In exemplary embodiments, the stand-off distance is in a range of 0.5 mm to 5 mm. If no other actions are taken, that is, if the moving stage (436) is not moved downwardly, e.g., vertically, the stand-off distance (454) will change as the stream of droplets (456) impacts on the fabricated object (478) and adds layer(s) of deposited material. On the next pass, creating the next deposition layer, the stand-off distance (454) would be reduced, if no other action is taken. In an exemplary embodiment, the stand-off distance (454) is maintained at or near a target stand-off distance. The maintenance of a constant stand-off distance can be achieved by adjusting the moving stage (436) vertically as necessary.

In an exemplary embodiment, the syringe pump (405) controls the flow rate of the liquid materials to affect the distribution of the spray so as to obtain a monodispersed droplet production. In an exemplary embodiment, the monodispersed droplets each contain a statistical average of a single nanoparticle per monodispersed droplet. The number of nanoparticles per droplet can be controlled by selection of an appropriate concentration of nanoparticles for a given droplet size.

In an exemplary embodiment, the flow rate is controlled in combination with the moving stage (436) to produce print velocities in a range of, for example, 0.0001 mm (0.1 micron) to 100 mm per second. In an exemplary embodiment, the volumetric flow rate is, by way of example and not limitation, about 0.1 picoliters ($0.1 \times 10^{-12}$ liters) per second. An example of a suitable moving stage is an XYZ piezo stage (LP300) from MadCityLabs, although this example is not intended to be limiting as there are other acceptable commercial moving stages.

Electrospray, also known as electrostatic atomization, typically involves the atomization of a liquid through the Coulombic interaction of charges and the applied electric field. Electrostatic atomization offers several advantages over alternative atomization techniques. Electrospray droplet streams are mainly due to the net charge on the surface of the droplets and the Coulombic repulsion of the droplets. This net charge causes the droplets to disperse, preventing their coalescence.

The trajectory of a charged droplet can be guided by the electrostatic field. According to an embodiment, the electrical power supplied to the extractor electrode (422) for generating the electrostatic field is a 10 microamp square wave signal at a frequency of 22 kHz driven at 10 kilovolts peak-to-peak. In addition, the electrical mobility aerosol focusing is characterized in embodiments by previously deposited structures or layers acting as an intense electric field concentrator to attract subsequent droplets in-flight to the nanostructure. Another advantage of this type of atomization is the ability to control the size distribution of the spray and under specific electrodynamic operating conditions, obtain a monodispersed spray.

The electrical mobility of the in-flight droplets depends on, at least, the particle size and the electrical charge. The smaller the particle and/or the higher the electrical charge, the higher the electrical mobility. The electrical mobility, $Z_p$, is in general dependent on the particle diameter $d_p$, as shown by Equation (2):

$$Z_p = neC(dp)/3\pi\eta d_p \quad \text{Equation (2)}$$

wherein $d_p$ is the aerosol particle diameter, n is the number of electrical charges on the particle, e is the elementary charge, C is the Cunningham slip correction factor, which is a function of the aerosol diameter, and η is the gas viscosity.

Without wishing to be bound by theory, electrospray can be described as being characterized by the formation of the liquid meniscus at a capillary tip (Smith, 1986) which results from a number of forces acting on the interface, including surface tension, gravitational, electrostatics, inertial, and viscous forces. Sir Geoffrey Taylor was the first to calculate analytically a conical shape for the meniscus through the balance of surface tension and electrical normal stress forces which we now know is called the "Taylor cone" in electrospray and appears in the cone-jet mode (Taylor, 1964). Monodispersed ink droplets are ejected from the cone due to the accumulation of charge.

In the cone-jet mode, liquid leaves the capillary in the form of an axisymmetric cone with a thin jet emitted from its apex. The small jet of liquid issuing out of the print head is electrostatically charged when subjected to an intense electric field at the tip of the print head (Birmingham, et al., 2001). The charged droplets are propelled away from the print head by the Coulomb force and are dispersed out as a result of charge on the droplets. In conventional practice, the droplets are approximately 10 microns in diameter. In exemplary embodiments described herein, the droplets in connection deposition of all layers and structures are nanodroplets having diameters of, for example, 20 nanometers to 100 nanometers.

In exemplary embodiments, the droplets are comprised of a suspension (e.g., colloidal suspension) or ink containing the nanoparticles. During flight and/or after impact, the droplets containing the nanoparticles rapidly evaporate in microseconds, leaving only the nanoparticle.

Referring back to FIG. 4A, the electrospray apparatus (400) is shown with a heater (458) for adding thermal energy to the stream of droplets (456). In some embodiments, the heater (458) is used to add thermal energy to the stream of droplet (456) before impact with the deposition area (452). In the exemplary embodiment, the heater (458) is a radiation source that supplies thermal energy to the stream of droplets (456) with a radiation beam (460). More specifically, the heater (458) is an infrared laser, but in other embodiments may emit radiation at other parts of the spectrum than infrared and may be a heat source other than a laser. In an exemplary embodiment, the heater (458) is mounted outside the enclosure (414) and the radiation beam (460) passes through the enclosure (414), which in an exemplary embodiment is made of quartz. In an embodiment, the heater (458) is coupled to the utility base plate (434) of the moving stage (436). This mounting may require aiming control for the radiation beam (460), as the moving stage (436) moves relative to the print head (410) and hence the stream of droplets (456). Alternatively, the heater (458) may be coupled to the enclosure (414) or to the print head (410).

Figure 8:
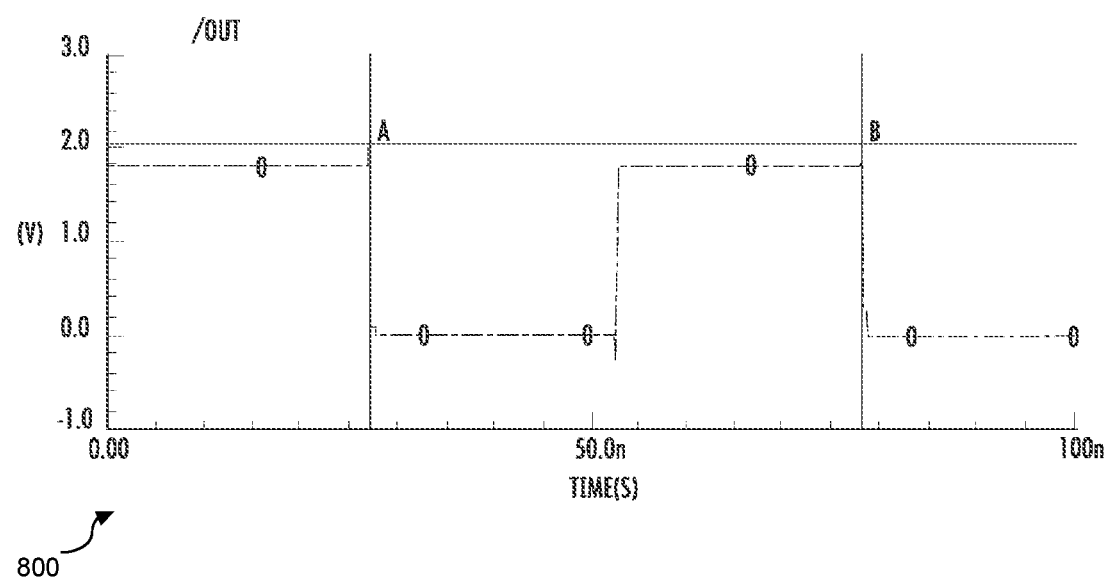
FIG. 8 is a graph of voltage readout for a ring oscillator electronic circuit.

In order to achieve higher production rates, such as by practicing parallel device fabrication or serial device fabrication, multiple print heads (410) can be used. According to an embodiment, the electrospray apparatus (400) has more than one capillary needle (402) and more than one print head (410), e.g., with each print head (410) associated with a respective capillary needle (402). In another embodiment, the electrospray apparatus (400) has a capillary needle (402) associated with a plurality of capillary tubes (411) and a plurality of print heads (410), e.g., with each of the print heads (410) associated with a respective capillary tube (411). According to the above-described and other multiple print head embodiments, each print head (410) may be associated with a respective extractor electrode (422). An example of a multi-head electrospray apparatus is illustrated in FIG. 8 of U.S. Application Publication No. 2015/0251213.

The utility of a multi-nozzle electrospray apparatus is apparent from the following example. According to an embodiment, electrospraying a droplet with a diameter of 100 nm at 10 kHz (10,000 per second) ejections, the printing flow rate from a single electrospray capillary is 5 to 100 femtoliters ($5 \times 10^{-15}$ L) per second. To achieve drop overlap to ensure good conductivity of metal nanoparticle traces, a print speed of 100 microns per second would result in a printing time of 10 seconds for a 10 micron-size square. Extrapolating to a standard Very Large Scale Integrated (VLSI) chip with an area of 1 $cm^2$ at a dense patterning at 10 nm resolution, 100 nozzles would take about a day to complete the VLSI chip, which represents an excellent production rate compared to current industrial processes.

Figure 5:
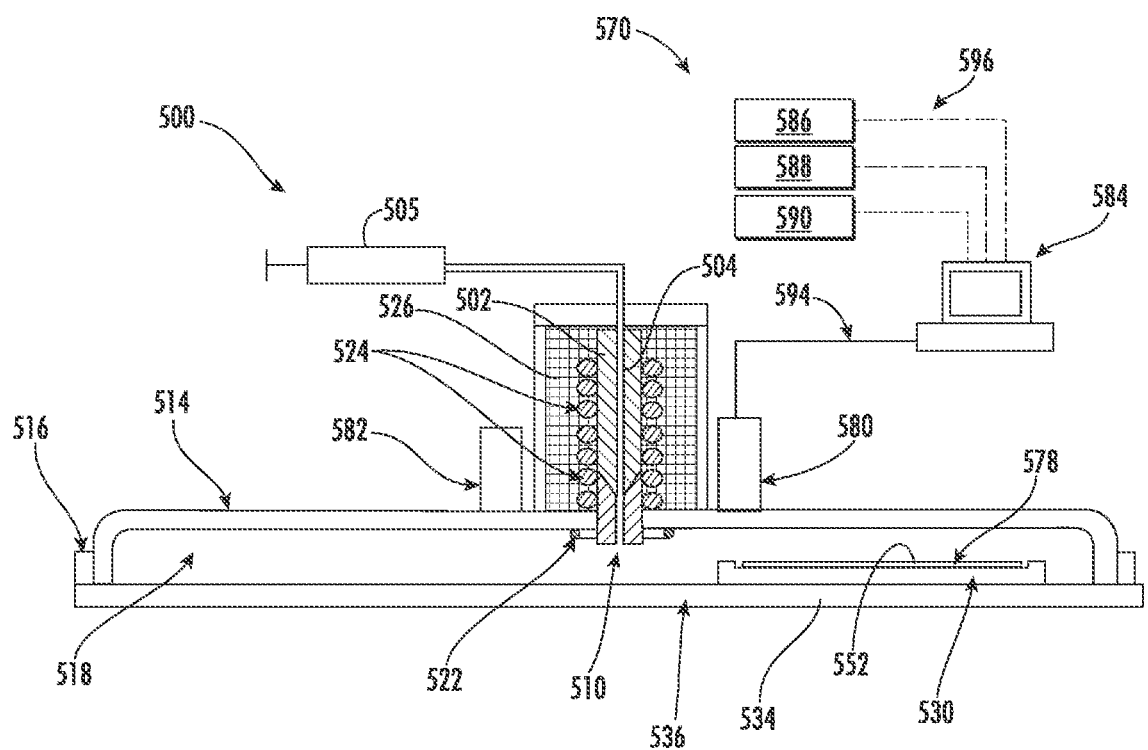
FIG. 5 is a side sectional view of an electrospray apparatus modified to include one or more profilometers and a control system.

FIG. 5 shows the exemplary electrospray apparatus (500) with many of the same components of the apparatus (400) of FIGS. 4A and 4B, including capillary needle (502), central conduit (504), syringe pump (505), print head (510), enclosure (514), enclosure floating frame (516), enclosure cavity (518), extractor electrode (522), induction heating coils (524), Faraday cage (526), object holder (530), unitary base plate (534), moving stage (536), and fabricated object (578). Additional components and features of FIGS. 4A and 4B are illustrated, but not identified by a reference numeral, in FIG. 5. Other components of FIGS. 4A and 4B may be missing from FIG. 5 for the sake of simplicity. The above discussion of corresponding components and features from FIGS. 4A and 4B are incorporated herein with respect to the description of FIG. 5.

The exemplary electrospray apparatus (500) of FIG. 5 includes first and second optical profilometers (580) and (582), respectively, and a control system (570). The first optical profilometer (580) is configured for measuring the distance to a deposition area (552) of the fabricated object (578). As the moving stage (536) moves the fabricated object (578) under the first optical profilometer (580), the first optical profilometer (580) measures the distance to the deposition area (552) of the fabricated object (578) at specific time intervals, creating profile data about the fabricated object (578), or more specifically, about the current deposited layer of the fabricated object (578). This profile data is sent to a main control unit (584) via a profilometer communication link (594), which may be wired or wireless. The exemplary embodiment also includes the second optical profilometer (582), but other embodiments may have more or fewer profilometers.

The main control unit (584) uses the profile data to control the electrospray apparatus (500) during deposition of the next deposition layer. For deposition of the next deposition layer, the main control unit (584) has the moving stage (536) move vertically as necessary to maintain the stand-off distance (554) at the target stand-off distance, based on the profile data of the proceeding deposition layer. It should be understood, however, that the structures fabricated with the exemplary electrospray apparatus (500) may be comprised of a single deposition layer.

The main control unit (584) also uses the profile data to compensate for errors in the previous deposition layers. If the profile data of the proceeding deposition layer indicates that some region of the fabricated object (578) is too thick, the main control unit (584) can correct on the next deposition layer by slowing the flow rate of liquid material from the print head (510) when over that region. Likewise, if the profile data of the proceeding deposition layer indicates that some region of the fabricated object (578) is too thin, the main control unit (584) can correct on the next deposition layer by increasing the flow rate of liquid material through the print head (510) when over that region.

The main control unit (584) is connected by main control unit communication links (596) to one or more sub-control units. The apparatus (500) is illustrated including a first sub-control unit (586) for controlling the moving stage (536), a second sub-control unit (588) for controlling the extractor electrode (522), and a third sub-control unit (590) for controlling a heater (such as heater (458) of FIG. 4).

Other embodiments may have more or fewer sub-control units, depending on the components they have.

Although not shown, the apparatus (400) or (500) can include a microscope to study droplet ejection, precise placement, and other aspects of the deposition process. An example of a suitable microscope is a Scanning Electron Microscope (SEM).

An exemplary method for fabricating a Single Electron Transistor (SET), such as but not limited to the SETs illustrated in FIGS. 1-3, will now be described with reference to flowchart (600) of FIG. 6. For convenience, the fabrication method represented by flowchart (600) is described in connection with the electrospray apparatus (400) and (500) of FIG. 4 and FIG. 5, respectively. The above description of the electrospray apparatus (400) and (500) is hereby incorporated into the discussion of the flowchart (600) of FIG. 6. It should be understood that electrospray apparatus other than those shown in FIGS. 4 and 5 and described above may be used for carrying out embodiments of the method, including but not limited to the embodiment illustrated in the flowchart (600) of FIG. 6. It should further be understood that the various steps of the flowchart (600) may be combined with one another, separated into sub-steps, practiced in a different sequence than shown, or otherwise modified, including by the omission of one or more of the steps of the flowchart (600).

Ambient conditions (e.g., temperature, humidity, and gas composition (e.g., air)) may be practiced in carrying out the various steps described herein.

Fabrication of the Substrate (602)

Figure 6:
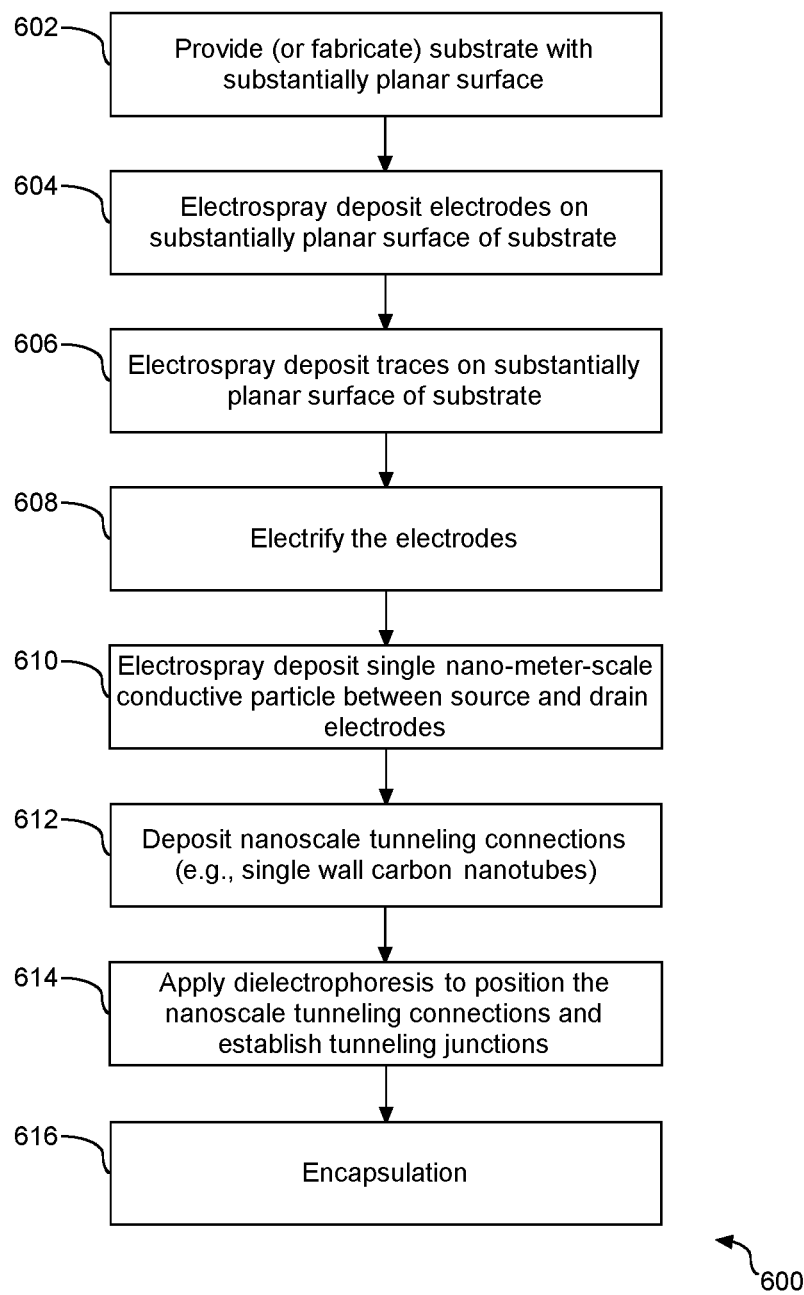
FIG. 6 is a flowchart of a fabrication method according to an exemplary embodiment.

Referring now to the flowchart (600) of FIG. 6, a substrate (also referred to as a wafer) (e.g., (232) and (332) of FIGS. 2 and 3, respectively) having a substantially planar surface is provided (602), either as a pre-fabricated substrate (or wafer) or by fabrication of the substrate (wafer). In an exemplary embodiment, the substrate, e.g., (232), (332) is fabricated by electrospray additive manufacturing using, for example, the electrospray apparatus (400) or (500) described above.

As mentioned above, in an exemplary embodiment the substrate (232), (332) is made of a material that is inert and/or dielectric, including polymers, especially but not limited to glossy polymers. Representative, non-limiting materials that may be used for the substrate (232), (332) include, for example, epoxies, ceramic nano-particle-filled resins (e.g., Grandio™), silica nanoparticle-reinforced epoxies (e.g., Futura Bond™), polydimethylsiloxane (PDMS), polymethylmethacrylate (PMMA), polymethylacrylate (PMA), polyvinylalcohol (PVA), polyvinylchloride (PVC), polyacrylic acid (PAA), Mercon™, phenyl-C61-butyric acid methyl ester (PCBM), pentacene, carbazoles, phthalocyanine, and aerogels, such as silica, aluminum, chromia, graphene oxide, and tin oxide aerogels. In an exemplary embodiment, the substrate (232), (332) is not made of, and is free of, a semiconductor material, such as silicon, gallium, arsine, carbides, etc. The substrate (232), (332) is deposited using monodispersed droplets in an exemplary embodiment.

In accordance with an embodiment, the substrate-forming material can be introduced into the electrospray apparatus (400) or (500) in a precursor form, including but not limited to monomeric, oligomeric, or pre-polymer form and be subject to polymerization initiated by, for example, the electrospray charge. In accordance with other embodiments, the substrate material may be introduced into the electrospray apparatus (400) or (500) as a solution, emulsion, or suspension, and in an embodiment as nanoparticles suspended in a solvent or liquid medium. In an exemplary embodiment, one or more surfactants may also be included to prevent agglomeration of the nanoparticles. Representative surfactants include, but are not limited to, TRITON®-100X, TWEEN®-20, and TWEEN®-80.

In an exemplary embodiment, the substrate-forming material is deposited as nano-scale droplets (or nanodroplets) having diameters in a range of, for example, 20 nanometers to 100 nanometers. During flight and/or upon impact on the object holder (430), (530), the carrier liquid evaporates, leaving the deposited nanoparticles to cure and build on one another.

In an exemplary embodiment, the surface of the resulting substrate is hydrophobic. Certain of the above exemplary materials, such as PDMS, are inherently hydrophobic materials. Others may be rendered hydrophobic by, for example, subjecting the surfaces to ionized gas (plasma) treatment.

The electrospray apparatus (400) or (500) allows for precise control over substrate thickness and topography. In an embodiment, the substrate is deposited by electrospray additive manufacturing to a thickness of 1 nanometer to 10 microns, although that range is not necessarily limiting. Control over the electrospray process can, in an exemplary embodiment, produce a substrate with a substantially planar surface. In an exemplary embodiment, the substantially planar surface is sufficiently planar to meet strict semiconductor fabrication requirements. In an embodiment, surface variations, as measured by a profilometer, of the area on which the SET is to be deposited are not greater than 5 nanometers, and in an exemplary embodiment not greater than 1 nanometer.

Electrospray Deposition of Electrodes (604)

The electrodes (e.g., source (202), (302A), (302B), drain (204), (304A), (304B), gate (206), (306A), (306B), and/or backgate) are fabricated directly on the substrate (e.g., (232), (332)) via electrospray deposition, more particularly an Electrical Nobility Aerosol Focusing (EMAF) technique. In an exemplary embodiment, the electrospray apparatus (400) or (500) is used to practice the EMAF technique.

Representative metals for forming the electrodes include, but are not limited to, gold, silver, and/or copper, although this list is not exhaustive. A representative non-metal for forming the electrodes includes, but is not limited to, graphene, although this list is likewise not limiting. The various electrodes (e.g., source, drain, gate, backgate) can be made of the same material or different materials in any combination.

The electrode-forming droplets discharged from the electrospray apparatus may be comprised of a solution, emulsion, or suspension, and in an embodiment as nanoparticles suspended, dissolved, or otherwise contained in a liquid carrier. In an exemplary embodiment, one or more colloidal inks are used for deposition of the electrodes. In an embodiment, the liquid carrier comprises an organic liquid such as an alcohol, aliphatic hydrocarbon, ester, ketone, others, and combinations including one or more of the same. During flight and/or upon impact on the target surface, the carrier liquid evaporates, leaving the deposited nanoparticle.

In an exemplary embodiment, the electrode-forming droplets comprise aerosols of monodispersed nanodroplets 20 nanometers to 100 nanometers in diameter. In an exemplary embodiment, the nanodroplets are deposited to overlap with one another in an exemplary embodiment to ensure good conductivity. By way of example only, a volumetric flowrate of about 0.1 picoliters per second may be practiced.

Electrospray Deposition of Conductive Traces (606)

The conductive traces (e.g., conductive lines (220), (222), and (224) in FIG. 2) are deposited in the same manner as described above with respect to the electrodes. The conductive traces and electrodes may be applied simultaneously or consecutively.

Electrification of Electrodes (608)

The electrodes are grounded to a checked ground on an electrical outlet. The software goes circuit by circuit to check similar to the electronic memory is quality-assured today. All the electrodes are grounded which creates the island target for the fast electrical mobility of the aerosol.

The charges on the nanoparticles and the electrodes average out to deposit the nanoparticles equidistance from electrodes. The electrification of the electrodes is used to precisely place the nanoparticle within the nanocircuit island location. The voltage applied guides the charged nanoparticle to its grounded location.

Electrospray Deposition of Quantum Island (610)

The quantum islands (e.g., (110), (210), (310A), and (310B) are deposited using the EMAF technique to electrospray nanodroplets. In an embodiment, the nanodroplets include a conductive particle in a liquid carrier. The conductive particle that forms the quantum island is, according the exemplary embodiments, a metal such as, for example, gold, silver, and/or copper, or a conductive non-metal, such as graphene. The conductive coating may, in turn include a coating comprising, for example, an alkane thiol. In another exemplary embodiment, the conductive particle comprises a substantially non-conductive core with a conductive coating. The core shape may be that of a sphere, for example. An exemplary core material is polystyrene latex (PSL). Suitable conductive coatings include, for example, gold, silver, copper, graphene and/or alkane thiols. In exemplary embodiments the carrier is a colloidal ink discussed above with reference to the electrodes. During flight and/or upon impact on the target surface, the carrier liquid evaporates, leaving the deposited nanoparticle.

Deposition of Nanoscale Connections (612)

The semiconductor connections or junctions between the electrodes and the quantum island are formed by nanoscale connectors. In an exemplary embodiment, those connectors are carbon nanotubes, and in a particular embodiment conductive single wall carbon nanotubes (SWCNTs). As described above with reference to FIG. 3, nanoscale connectors, e.g., (334A) and (334B), can each comprise one or more SWCNTs. In an exemplary embodiment, the SWCNTs have lengths in a range of 10 to 100 nanometers. In an additional exemplary embodiment, the SWCNTs have a diameter of about 1 nanometer.

The nanoscale connectors can be deposited, for example, using the electrospray apparatus (400) or (500). In an exemplary embodiment, the connectors (e.g., SWCNTs) are deposited as droplets in which the SWCNTs (or other connectors) are suspended in a carrier liquid. An example of a suitable carrier liquid for forming the droplets and entraining the SWCNTs is water. During flight and/or upon impact on the target surface, the carrier liquid (e.g., water) evaporates, leaving the deposited connector(s).

The suspension density affects the number of SWCNTs deposited. For example, a suspension having a SWCNTs suspension density of 10 μg/ml an average of one SWCNT per microliter of suspension. At such suspension densities, however, SWCNTs can agglomerate into bundles, reducing the uniformity of the suspension. To mitigate this problem, the SWCNT suspensions may be subject to horn sonication and subsequently filtered to remove larger bundles remaining after sonication.

Dielectrophoresis (614)

When the conductive traces (e.g., (220), (222), and (224) in FIG. 2) are powered, the nanoscale connectors (e.g., CNTs, SWCNTs) undergo dielectrophoresis (DEP) alignment movement. DEP relies on the application of electric fields to manipulate and position the CNTs. The aligned connectors electrically connect the source and drain electrodes to the quantum island (e.g., coated nanoparticle) to allow for the passage of electrons, completing the SET circuit. The current signal changes and the electricity flow is terminated when the SWCNTs reach the coated nanoparticle, typically within seconds during the DEP procedure.

The nanoscale connectors act as a bridge spanning the gaps between the electrodes and the single nanometer-scale conductive particle that serves as a quantum island. In an embodiment, after subject to DEP, one or more nanoscale connections establish a first junction between a source electrode and single nanometer-scale conductive particle and a second junction between the drain electrode and the single nanometer-scale conductive particle. In an embodiment, one or more of the SWCNTs extend lengthwise continuously between the source electrode and the drain electrode, coming within 1 nanometer of, and in a particularly exemplary embodiment coming into contact with, the nanometer-scale conductive particle. In another exemplary embodiment, one or more first SWCNTs extend from the source electrode to the single nano-scale conductive particle, and one or more second SWCNTs extend from first drain electrode to the single nano-scale conductive particle.

Initially, the CNTs expand into the gap and bring the two electrodes closer together. Once the bridging began, the primary effect of further CNT deposition is to fill in gaps in the network.

In-situ monitoring of the CNT DEP may be employed by measuring the current, voltage, and phase angle during deposition. The process is monitored by measuring the root-mean-square current amplitude (e.g., 6 mA to 30 mA) and relative phase angle (with the voltage from 0 to 30 degrees) during deposition. In an embodiment, DEP is terminated when the current reaches (e.g., plateaus at) a maximum. The measured data allow for a correlation between the CNT network densities thus establishing the feasibility of a closed-loop system suitable for industrial applications.

In a set of non-limiting experiments, initially the out-of-phase component, which is linearly related to the capacitance in a simple circuit model, rose quickly, and reached a transition point, at approximately one minute, where it changed. This change occurred as the SWCNTs began to bridge the electrode gap. Initially, the SWCNTs were expanding into the gap and bringing the two electrodes closer together. Once the bridging to the coated nanoparticle began, the primary effect of further SWCNT deposition was terminated. The SWCNT were able to rapidly connect to the coated nanoparticle because of the limited distance needed for alignment.

Once formed, the CNT/SWCNT or other connector network quality may be assessed using, for example, scanning electron microscopy (SEM) image analysis.

In an exemplary embodiment, the method comprises deposition of individual CNTs between arrays of electrodes and the assembly of large-area CNT networks. This exemplary DEP technique uses many electrospray-patterned electrodes to assemble CNT networks on a wafer in a manner appropriate for massively parallel device fabrication. The CNTs are deposited only where desired, resulting in negligible wasting of CNTs. In an exemplary embodiment, the technique can be used in a closed-loop system, enabling large-scale industrial application.

Encapsulation (616)

Encapsulation (616) of the nanoelectronics is performed principally to protect the SET from interfering effects such as background charge, excessive heat, and/or other hazardous conditions.

As mentioned above, the encapsulation material may be comprised of an. The apparatus (400) or (500) can be adapted to apply a sol-gel for formation of aerogels. The aerogel may be formed, for example, by printing or spraying a sol-gel onto a surface and allowing the sol-gel to dry at a suitable temperature and pressure, such as atmospheric temperature and atmospheric pressure. According to an embodiment, the sol-gel is sprayed from a print head having a 0.4 mm internal diameter orifice at flow rate in a range of 2 to 5 ml/min, with an applied electrical power of about 20 kilovolts peak-to-peak and a frequency of 22 kHz to generate the monodispersed droplets that are electrically propelled towards the wafer. According to an embodiment, the wafer is moved in the X-Y plane at about 50 mm/second.

According to an embodiment, to prepare the sol-gel, tetraethyl-ortho-silicate (TEOS) is diluted in alcohol (e.g., anhydrous ethanol or isopropanol) to about 10-20% TEOS. A catalyst (e.g., an acid such as dilute HCl, 1M) is added dropwise to the TEOS/alcohol solution while stirring, then allowed to sit (e.g., 24-48 hours) to permit polymerization of the silicate and generation of a sol-gel. The sol-gel is diluted with alcohol and stored at a relatively low temperature (e.g., refrigeration) to slow further polymerization. Before use, the sol-gel may be diluted as for electrospray application to a desired coating thickness.

Electrospraying sol-gel creates a thin film aerogel condensation event. Electrospraying may be conducted in a heated (or elevated temperature) environment to cure the sol-gel and form the aerogel. Suitable elevated temperatures include, for example, 35° C. to 40° C. Cure temperature affects pore size. Generally, pore size increases with increased cure temperature, and decreases with decreased cure temperature. Gel time can be reduced by reducing the amount of alcohol and/or by adding additional catalyst (e.g., an acid such as HCl), although excess catalyst can result in shorter polymeric chains.

Exemplary Nanoelectronics SET Device: Ring Oscillator

The following description of a ring oscillator incorporating SETs is provided by way of example, and is not limiting or exhaustive of the possible applications of the SETs and related methods disclosed herein.

Figure 7:
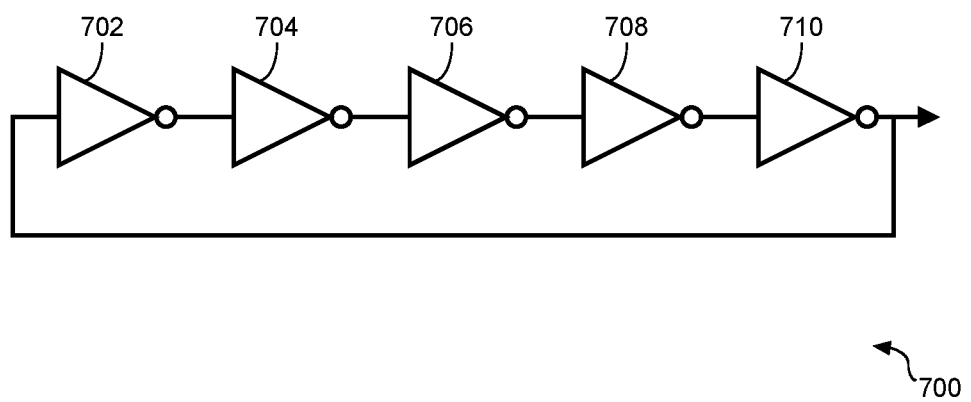
FIG. 7 is a schematic diagram of a ring oscillator electronic circuit according to an exemplary embodiment.

A ring oscillator is a device comprising an odd number of gates whose output oscillates between two voltage levels. In an embodiment, the gates, also referred to as inverters, are attached in a chain. An example of a ring oscillator circuit according to an embodiment is generally designated by reference numeral (700) in FIG. 7.

The ring oscillator circuit (700) includes a ring comprising a plurality of gates or inverters (702), (704), (706), (708), and (710). The output of gates (702)-(710) oscillates between two voltage levels, with the output of the last gate (710) being fed back to the first gate (702) to cause oscillation.

Each of the gates (702)-(710) includes a respective SET using conductive SWCNT connections. The circuit layout is designed such that the same type SET from contiguous inverter stages access different source/drain contacts, which makes the circuit less compact. According to an embodiment, the complete circuit (700) is less than 90 nm² in area.

Due to their small diameters, SWCNT carry microampere currents (despite the current density being much higher for silicon circuits), which is the main challenge for measurements using available instruments designed for semiconductors carrying milliampere currents. As a direct result of this small current, the ring oscillator (700) has an output impedance of a few megaohms (MΩ). This causes a mismatch with the 50 V input impedance of the spectrum analyzer and results in rather small signals.

Referring to FIG. 8, a graph (800) is depicted to illustrate a voltage readout for the ring oscillator electronic circuit. As shown in FIG. 8, the illustrated ring oscillator (700) had a delay of about 50 ns that resulted in a clock frequency of about 19 MHz. The signal periodicity of a ring-oscillator can be altered by changing the input voltage.

Modeling of Precise Deposition of Monodispersed Droplets

A fine jet issues from the apex of the Taylor cone (450) and eventually breaks up into a spray of monodispersed droplets. The cone-jet electrospray produces monodispersed particles [Fernandez de la Mora et al. 1990]. The cone-jet electrospray produces monodispersed particles with relative ease, which is a unique capability in the nanometer scale range.

A model that tracks each droplet in a dilute two-phase flow is the result of a force balance equation. The force balance on the droplet is expressed in Equation (3) (where the magnetic field is ignored):

$$\rho_d g \left[\frac{\pi D^3}{6}\right] = \rho g \left[\frac{\pi D^3}{6}\right] + C_D \left[\frac{\pi D^2}{4}\right]\left[\frac{\rho V^2}{2}\right] + qE \quad \text{Equation (3)}$$

Where the space charge effects are ignored, $\rho_d$ is the particle density (3160 Kg/m), g is gravity (9.8 m/s²), D is the droplet diameter (e.g., 20 nm to 100 nm=20×10⁻⁹ to 100× 10⁻⁹ m), $\rho$ is the argon density, V is the droplet velocity, $C_D$ is the drag coefficient, q is the charge on a droplet (14 C/kg of droplets) and E is the driving electric field (5 kV/cm).

The right-hand side terms account for the drag force by the surrounding gas, the force on the droplets by the external electric field, the mutual electric force between charged droplets, and the electric force between the droplet and the induced charge on conductive substrates (image force), respectively. The image charges induced by the charged droplets on the extractor and collector surfaces, both of which are treated as large planes, are ignored. The surface charge density is assumed constant for all droplets (De Juan & Fernandez de la Mora, 1997). This assumption is reasonable for droplets used in this work, since the charge relaxation time is one order of magnitude larger than the jet breakup time. Therefore, the charge remains approximately "frozen" during the jet breakup.

Below, a spray profile model is derived to describe how the spray expands after the cone-jet breaks up. The following assumptions are used to simplify the problem where z is the distance from the electrospray nozzle to the substrate and R is the spread of the electrospray micron-sized or nano-droplets due to inertia and charge repulsion:

i. The spray consists only of monodispersed, mutually charged droplets. The inertia of the droplet is small and negligible; therefore, the motion of the droplets is dictated by the electric field, such that V=ZE, where Z is the mobility of the droplet, V is the droplet velocity, and E is the electric field. For an inertia-less droplet, Z=q/3πμD, where q is the charge carried by each droplet, µ, is the dynamic viscosity of the gaseous phase media, and D is the droplet diameter.

ii. The axial velocity of the droplet, $V_A$, is constant along z direction (FIG. 3) and does not vary along the radial direction. This assumption is rooted from previous experimental measurements, which show that the typical axial velocity variation is less than 10%.

iii. The volumetric charge density, ρ, does not vary along the radial direction, i.e., $\partial \rho / \partial r = 0$. In this calculation, this assumption is generally true with the exception of droplets at the outskirts of the spray. This assumption yields the expression, $\rho = I_0 / \pi R^2 V_A$ where $I_0$ is the electric current carried by the spray, and R is the spray radial expansion.

iv. The z-component of the space charge field, Ep, is negligible compared to the magnitude of the driving field $E_d$. The numerically computed z-component (FIG. 3) of the space charge field, $E_\rho$, is indeed a small fraction of a typical driving field of 5 kV/cm except for a short region near z=0.

To derive the spray profile mode, the law of charge conservation [see Equation (4)] is a starting point:

$$\nabla \cdot (\rho V) + \frac{\partial \rho}{\partial t} = 0 \qquad \text{Equation (4)}$$

At steady state, $\partial \rho / \partial t = 0$ and Equation 4 becomes $\nabla \cdot (\rho V) = 0$ where V=ZE [see Equation (5)]:

$$ZE \cdot \nabla \rho + Z\rho \nabla \cdot E = 0 \qquad \text{Equation (5)}$$

In cylindrical coordinates, because ρ does not change along the radial direction, the first term of Equation (5) becomes:

$$ZE \cdot \nabla \rho = Z\left[E_x \frac{\partial \rho}{\partial t} + E_r \frac{\partial \rho}{\partial r}\right] = ZE_x \left(\frac{\partial \rho}{\partial x}\right) \qquad \text{Equation (6)}$$

The second term of Equation (5) can be rewritten using Gauss's law:

$$Z\rho \nabla \cdot E = Z \frac{\rho^2}{\varepsilon_0} \qquad \text{Equation (7)}$$

From Equations (5) to (7), Equation (8) is reached:

$$Z \frac{\rho^2}{\varepsilon_0} + V \frac{\partial \rho}{\partial x} = 0 \qquad \text{Equation (8)}$$

The solution to Equation (8) is:

$$\frac{1}{\rho} + \frac{1}{\rho_0} = \frac{Z}{\varepsilon_0 V} x$$

where V is the velocity of the micron-sized or nanodroplets, $\rho_0 = \rho(x=0)$, or at the entrance of the electrospray. Initially the droplets are linearly aligned right after cone-jet breakup, making $\rho_0$ a very large value and $1/\rho_0$ is negligible compared to lip. On the other hand, since $V_A=E_dZ$, where Equation (9) is reduced to:

$$R=\left[\frac{I_0}{\varepsilon_0\pi E^2 Z}x\right]^{1/2} \qquad \text{Equation (9)}$$

Equation (9) suggests that if the spray profile is viewed from the direction perpendicular to the spray axis, the profile is parabolic and also suggests that the spray diameter is inversely proportional to the intensity of the driving field.

In an embodiment, the combination of the extractive electrode and the inductive coil minimizes the electrospray radial expansion. The imposition of a magnetic field (to counter the radial spreading of the existing electric fields) enables precise deposition without pre-charging a surface with electron-beams. The limit of precision of this electrospray deposition method is twice the diameter of the droplet, 2D. The inductive element (coil) is imposed within the extractor electrode (422), (522) where the force on a droplet is related to the magnetic flux density, B, the velocity of the droplet, V, and the charge on the droplet, q, as found in Equation (10):

$$F=qVB \qquad \text{Equation (10)}$$

The larger the magnetic flux imposed, the closer to the precision deposition limit, 2D, one achieves. The axis of the intensity of the magnetic flux is perpendicular to the substrate for greatest precision.

Electrosprayed droplet impact dynamics can be characterized in terms of Weber, (We), and Ohnesorge, (Oh), dimensionless numbers as found in Equations (11) and (12).

$$We=\frac{\rho D^2 V^2}{\gamma} \qquad \text{Equation (11)}$$

$$Oh=\frac{\mu}{(\rho\gamma D)^{0.5}} \qquad \text{Equation (12)}$$

where ρ is the liquid mass density, V is the droplet impacting velocity, D is the droplet diameter, γ is the liquid interfacial tension, and μ is the liquid dynamic viscosity. For electrosprayed droplets impacting a surface, the Weber is approximately 10 while the Ohnesorge number is around 0.1 corresponding to a relatively gentle impact without splashing. The lower impact velocity offers control of the trajectory of each droplet making it possible to build-up complex objects.

The impact of an electrosprayed droplet follows a typical three-stage sequence [Deng 2010]:

1. Impact (0-20 μs) during which the droplet contacts the heat substrate, $T_s$, and deforms from a sphere to closer to a liquid disk reaching maximum spread diameter.

2. Typical recoil (20-45 μs) during which the surface tension drives the oscillating liquid after impact is minimized due to the small size of the droplets. Even picoliter and femtoliter droplets do not rebound.

3. Quasi-steady solidification (>45 μs) during which the sessile droplet retains its flattened shape (described as a splat) and shrinks inducing stress. This stress is alleviated by keeping the substrate below the recrystallization temperature. If the stress was not alleviated, micro-cracking would occur.

In electrospray deposition of nanostructures, nanoparticles are of the same relative size and have similar thermodynamic states. In addition, uniform charging of the monodispersed droplets is imposed. For a charged droplet, the electric charge causes an additional tension along the liquid-gas interface that weakens the surface tension. The weakening of the surface tension has a spherodizing effect on the deposition and pulls liquid toward the grounded surface effectively filling any pores. Besides pore-filling that eliminates porosity, a bridging monolayer forms that bonds along the droplet interfaces. Nanoparticles, once at the droplet interfaces, can be thought of irreversibly adsorbed. Electrostatic repulsion of the charged nanoparticles causes the distribution of these materials on the surface to be uniform. These uniform features offer significant advantages in reduction of the number and size of voids or cracks in the final product. The electrosprayed nanostructures that result from the accumulation of nano-materials determine the properties such as porosity, adhesion strength, and fracture toughness.

Incorporation of Heat-Harvester into Nanoelectronics Including SET

One or more energy harvesting devices having nano-scale characteristics can be employed as power sources for circuits including the SETs described herein. The energy harvesting devices described herein provide, for example, a stable voltage of about 1.1 V.

Generally, thermionic power conversion presents an avenue to convert thermal energy into electrical energy. Thermoelectric power conversion generators convert thermal energy to electrical energy by an emission of electrons from a heated emitter electrode (i.e., a cathode). Electrons flow from an emitter electrode, across an inter-electrode gap, to a collector electrode (i.e., an anode), through an external load, and return back to the emitter electrode, thereby converting heat to electrical energy. Recent improvements in thermionic power converters pertain to material selection based on work functions and corresponding work function values for the electrodes and using a fluid to fill the inter-electrode gap. Electron transfer density is limited by the materials of the electrodes and the materials of the fluid in the inter-electrode gap (i.e., the associated work functions).

Figure 9:
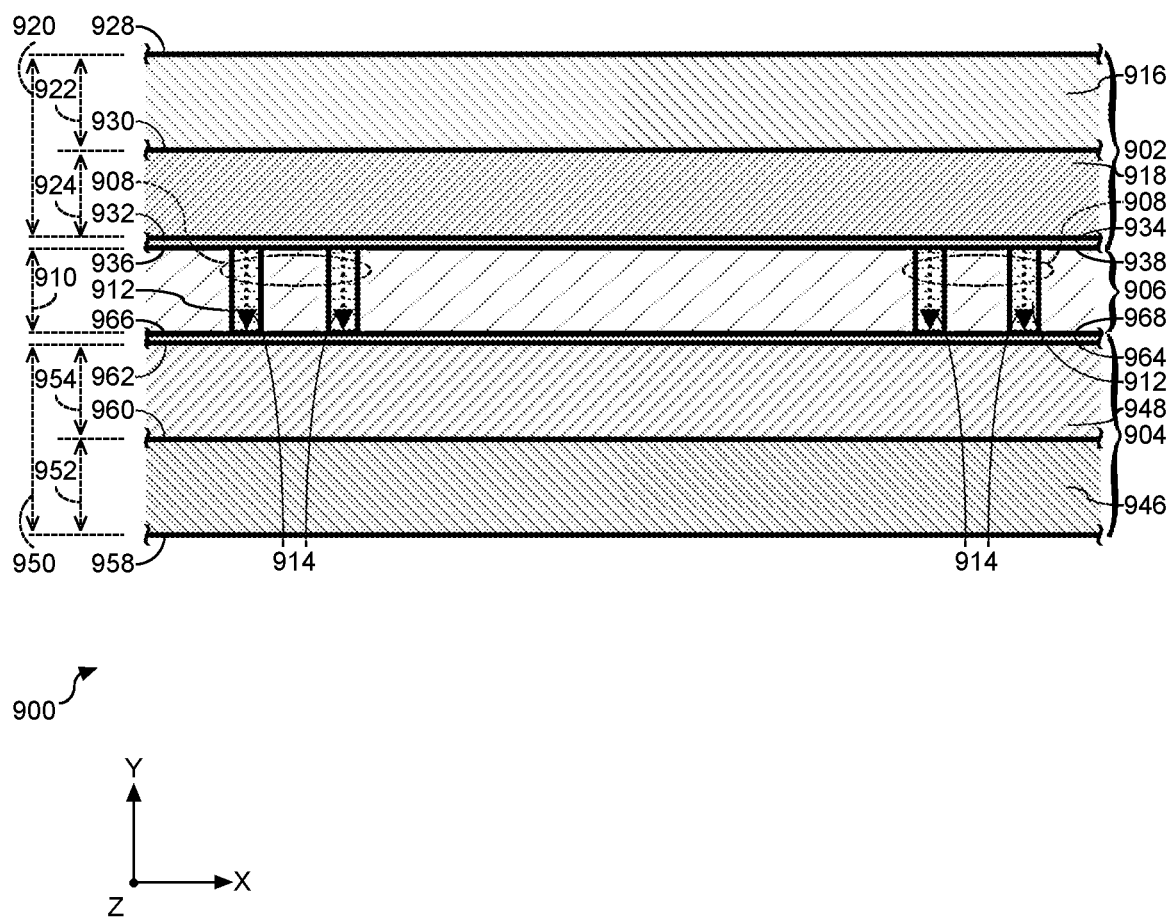
FIG. 9 is a cross-sectional view of an energy harvesting device for incorporation, as a power source, into a circuit containing one or more single electron transistors.

To provide additional details for an improved understanding of selected embodiments of the present disclosure that combine the use of thermoelectric and thermionic power conversion, reference is now made FIG. 9 illustrating a sectional view of an embodiment of an energy harvesting device (900) that is configured to generate electrical power. Each of the dimensions, including a thickness dimension defined parallel to a first-axis, also referred to herein as a vertical axis, i.e. Y-axis in FIG. 9, a longitudinal dimension parallel to a second-axis, i.e., X-axis in FIG. 9, also referred to herein as a horizontal axis, and a lateral dimension parallel to a third axis-axis, i.e. Z-axis in FIG. 9, orthogonal to the first-axis and second axis, are shown for reference. The X-axis, Y-axis, and Z-axis are orthogonal to each other in physical space.

The energy harvesting device (900) is sometimes referred to herein as a cell. In exemplary embodiments, the energy harvesting device (900) is illustrated as a sheet or a plurality of adjacently positioned sheets. A plurality of devices (900) may be organized as a plurality of cells, or a plurality of layers, with the cells or layers arranged in series or parallel, or a combination of both to generate electrical power at the desired voltage, current, and power output.

The energy harvesting device (900) includes an emitter electrode (also referred to herein as the cathode) (902) and a collector electrode (also referred to herein as the anode) (904) positioned to define an inter-electrode gap (or interstitial space) therebetween. In an embodiment, a spacer (906) of separation material, sometimes referred to herein as a standoff or spacer, maintains separation between the electrodes (902) and (904). While the spacer (906) is referred to herein in the singular, it should be understood that the spacer (906) may comprise a plurality of elements. The spacer (906) may be an insulator or comprise one or more materials that collectively exhibit non-conductive properties. The spacer (906) is illustrated in direct contact with the electrodes (902) and (904). The electrodes (902) and (904) and the spacer (906) define a plurality of closed apertures (908), also referred to herein as cavities, in the inter-electrode gap. The apertures (908) extend in the Y direction between the electrodes (902) and (904) for a distance (910) in the range, for example, of about 1 nanometer (nm) to about 100 nm, or in the range, for example, of about 1 nm to about 20 nm. A fluid (912), also referred to as a nano-fluid (discussed further herein with reference to FIG. 10), is received and maintained within each aperture (908).

In an alternative embodiment, no spacer (906) is used and only the nano-fluid (912) is positioned between the electrodes (902) and (904). Accordingly, the energy harvesting device (900) includes two opposing electrodes (902) and (904), optionally separated by the spacer (906) with a plurality of apertures (908) extending between the electrodes (902) and (904) and configured to receive the nano-fluid (912).

The emitter electrode (902) and the collector electrode (904) each may be fabricated from different materials, with the different materials having separate and different work function values. The work function of a material or a combination of materials is the minimum thermodynamic work, i.e., minimum energy, needed to remove an electron from a solid to a point in a vacuum immediately outside a solid surface of the material. The work function is a material-dependent characteristic. Work function values are typically expressed in units of electron volts (eV). Accordingly, the work function of a material determines the minimum energy required for electrons to escape the surface, with lower work functions generally facilitating electron emission.

The difference in work function values between the electrodes (902) and (904) due to the different electrode materials is essentially the voltage that can be achieved. Thus, to generate high power, the difference in work function values between the electrodes (902) and (904) is large in an exemplary embodiment. In an exemplary embodiment, the work function value of the collector electrode (904) is smaller than the work function value of the emitter electrode (902). The different work function values induces a contact potential difference between the electrodes (902) and (904) that has to be overcome, e.g., by the application of heat to the emitter electrode (902), to transmit electrons through the fluid (912) within the apertures (908) from the emitter electrode (902) to the collector electrode (904). The total of the work function value of the collector electrode (904) and the contact potential difference is less than or equal to the work function of the emitter electrode (902) in an exemplary embodiment. Maximum flow occurs when the total of the work function value of the collector electrode (904) and the contact potential equals the work function of the emitter electrode (902).

Both electrodes (902) and (904) emit electrons; however, once the contact potential difference is overcome, the emitter electrode (902) will emit significantly more electrons than the collector electrode (904). A net flow of electrons will be transferred from the emitter electrode (902) to the collector electrode (904), and a net electron current (914) will flow from the emitter electrode (902) to the collector electrode (904) through the apertures (908). This net electron current (914) causes the emitter electrode (902) to become positively charged and the collector electrode (904) to become negatively charged. Accordingly, the energy harvesting device (900) generates an electron current (914) that is transmitted from the emitter electrode (902) to the collector electrode (904).

The emitter electrode (902) may be manufactured with a first backing (916), which may comprise, for example, a polyester film, e.g., Mylar®, and a first layer (918) extending over the first backing (916). The first layer (918) may be comprised of graphene, platinum (Pt), or other suitable materials. The emitter electrode (902) has an emitter electrode thickness measurement (920) extending in the Y direction that is, for example, approximately 0.25 millimeters (mm), such measurement being non-limiting, or in a range of, for example, about 2 nm to about 0.25 mm, such measurements being non-limiting. The first backing (916) is shown in FIG. 9 with a first backing thickness measurement (922), and the first layer (918) is shown herein with a first layer thickness measurement (924), each extending in the Y direction. The first backing thickness measurement (922) and the first layer thickness measurement (924) range of, for example, about 0.01 mm to about 0.125 mm, or, for example, 0.125 mm, such values being non-limiting. The first backing measurement (922) and the first layer measurement (924) may have the same or different measurement values.

In exemplary embodiments, the first layer (918) is sprayed onto the first backing (916) so as to embody the first layer (918) as a nanoparticle layer that is approximately 2 nm (i.e., the approximate length of a nanoparticle), where the 2 nm value should be considered non-limiting. The first layer (918) may range from, for example, about 1 nm to about 20 nm. The first backing (916) has a first outer surface (928). The first backing (916) and the first layer (or the nanoparticle layer) (918) define a first interface (930). The first layer (or the nanoparticle layer) (918) defines a first surface (932) facing the inter-electrode gap. Alternatively, the first layer (918) may be pre-formed and applied to the first backing layer (916).

A first coating (934), such as cesium oxide ($Cs_2O$), covers at least part of and optionally the entirety of the first surface (932) to form an emitter surface (936) of the first electrode (902) that directly interfaces with a first spacer surface (938). Accordingly, the emitter electrode (902) of the embodiment illustrated in FIG. 9 includes a first layer (or nanoparticle layer) (918) on a first backing (916) and the first coating (934) on the first surface (932).

In FIG. 9, the collector electrode (904) includes a second backing (946), which may be comprised of a polyester film, and at least one second layer (948), which may be comprised of, for example, graphene or aluminum (Al), extending over the second backing (946). The collector electrode (904) has a collector electrode thickness measurement (950) extending in the Y direction that is, for example, approximately 0.25 millimeters (mm), such measurement being non-limiting, or in a range of, for example, about 2 nm to about 0.25 mm, such values being non-limiting. For example, a second backing measurement (952) of the second backing (946) and a second layer measurement (954) of the layer (948) are each approximately 0.125 mm, such values being non-limiting. The second backing measurement (952) and the second layer measurement (954) may range from, for example, about 0.01 mm to about 0.125 mm, or each approximately 0.125 mm, such values being non-limiting. The second backing measurement (952) and the second layer measurement (954) may have the same or different measurement values.

In an embodiment, the second layer (948) is sprayed on to the second backing (946) to embody the second layer (948) as a second nanoparticle layer that is approximately 2 nm, where the 2 nm value should be considered non-limiting. Alternatively, the second layer (948) may be pre-formed and applied to the second backing (946). The second layer measurement (954) of the second layer (948) may range from, for example, approximately 1 nm to about 20 nm. The second backing (946) has a second outer surface (958). The second backing (946) and the second layer/nanoparticle layer (948) define a second interface (960). The second layer (or the second nanoparticle layer) (948) defines a second surface (962) facing the inter-electrode gap.

A second coating (964), which may be comprised of cesium oxide ($Cs_2O$), at least partially covers the second surface (962) to form a collector surface (966) of the collector electrode (904) that directly interfaces with a second surface (968) of the spacer (906). Accordingly, the collector electrode (904) of FIG. 9 includes the second layer/nanoparticle layer (948) on the second backing (946) and the $Cs_2O$ coating (964) on the second surface (962).

The first coating (934) and the second coating (964) are formed on the first and second surfaces (932) and (962), respectively. In an embodiment, an electrospray or a nanofabrication technique is employed to form or apply the first and second coatings (934) and (964), respectively. The first and second coatings (934) and (964) can be applied in one or more predetermined patterns that may be the same as or different from one another.

A percentage of coverage of each of the first surface (932) and second surface (962) with the respective ($Cs_2O$) coating layers (934) and (964) is within a range of at least 50%, and up to 70%, and in at least one embodiment is about 60%. The $Cs_2O$ coatings (934) and (964) reduce the work function values of the electrodes (902) and (904) from the work function values of platinum (Pt), which in one embodiment is 5.65 electron volts (eV), and aluminum (Al), which in one embodiment is 4.28 eV. The emitter electrode (902) with the $Cs_2O$ coating layer has a work function value ranging from about 0.5 to about 2.0 eV, and in an embodiment is approximately 1.5 eV, and the collector electrode (904) with the $Cs_2O$ coating layer has a work function value of about 0.5 to about 2.0 eV, and in an embodiment is approximately 1.5 eV. In an embodiment, the electrodes (902) and (904) are comprised of graphene, and are referred to herein as graphene electrodes (902) and (904). The graphene electrodes (902) and (904) can exhibit work function values below 1.0 eV when coated with cesium oxide, gold, tungsten, and other elements and compounds. Sulfur may be incorporated into the coatings (934) and (964) to improve the bonding of the coating to the graphene electrodes (902) and (904), particularly where the electrodes are graphene and the sulfur creates covalent bonding between the electrodes (902) and (904) and their respective coatings (934) and (964). The respective work function values of the electrodes (902) and (904) can be made to differ, even when both are comprised of graphene, by applying different coatings (934) and (964) to the electrodes (902) and (904). Suitable graphene electrodes are available through ACS (Advanced Chemical Suppliers) Materials, and include Trivial Transfer Graphene™ (TTG 10055).

In an embodiment, the surface area coverage on the emitter electrode (902) or the collector electrode (904) with $Cs_2O$ is spatially resolved, e.g. applied in a pattern or non-uniform across the length of the corresponding surface, and provides a reduction in a corresponding work function to a minimum value. In an exemplary embodiment, the work function value, from a maximum of about 2.0 eV is reduced approximately 60-80% corresponding to the surface coverage of the $Cs_2O$, e.g. cesium oxide. Accordingly, the lower work function values of the electrodes (902) and (904) improve operation of the energy harvesting device (900) as described herein.

Platinum (Pt) and aluminum (Al) materials optionally are selected for the first and second electrodes (902) and (904), respectively, due to at least some of their metallic properties, e.g., strength and resistance to corrosion, and the measured change in work function values when the thermionic emissive material of $Cs_2O$ is layered thereon. Alternative materials may be used, such as graphene, noble metals including, and without limitation, rhenium (Re), osmium (Os), ruthenium (Ru), tantalum (Ta), iridium (Ir), rhodium (Rh), and palladium (Pd), or any combination of these metals. In addition, and without limitation, non-noble metals such as gold (Au), tungsten (W), and molybdenum (Mo), and combinations thereof, may also be used. For example, and without limitation, tungsten (W) nanoparticles may be used rather than platinum (Pt) nanoparticles to form the first surface (932), and gold (Au) nanoparticles may be used rather than aluminum (Al) nanoparticles to form the second surface (962). Accordingly, the selection of the materials to use to form the nanoparticle surfaces (932) and (962) can be principally based on the work functions of the electrodes (902) and (904), and more specifically, the difference in the work functions once the electrodes (902) and (904) are fully fabricated.

The selection of the first and second coatings (934) and (964), e.g., thermionic electron emissive material, on the first surface (932) and second surface (962), respectively, may be partially based on the desired work function value of the electrodes (902) and (904), respectively, and chemical compatibility between the deposited materials, and the deposited thermionic electron emissive materials of the first and second coatings (934) and (964). Deposition materials include, but are not limited to, thorium, aluminum, cerium, and scandium, as well as oxides of alkali or alkaline earth metals, such as cesium, barium, calcium, and strontium, as well as combinations thereof and combinations with other materials. In at least one embodiment, the thickness of the layer of patterned thermionic electron emissive material of the first and second coatings (934) and (964) is approximately 2 nm, where the 2 nm value should be considered non-limiting. Accordingly, the electrodes (902) and (904) have the desired work functions.

Exemplary electrospray and nano-fabrication technique(s) and associated equipment, including three-dimensional printing and four-dimensional printing (in which the fourth dimension is varying the composition during printing to tailor properties) for forming the first layer/first nanoparticle layer (918), the second layer/second nanoparticle layer (948), the spacer (906) and other layers and coatings discussed herein, including those of the device (900), are set forth above, including at least in connection with the description of FIGS. 4A, 4B, and 5. Generally, that application discloses a composition including a nano-structural material, grain grow inhibitor nanoparticles, and at least one of a tailoring solute or tailoring nanoparticles.

Figure 10:
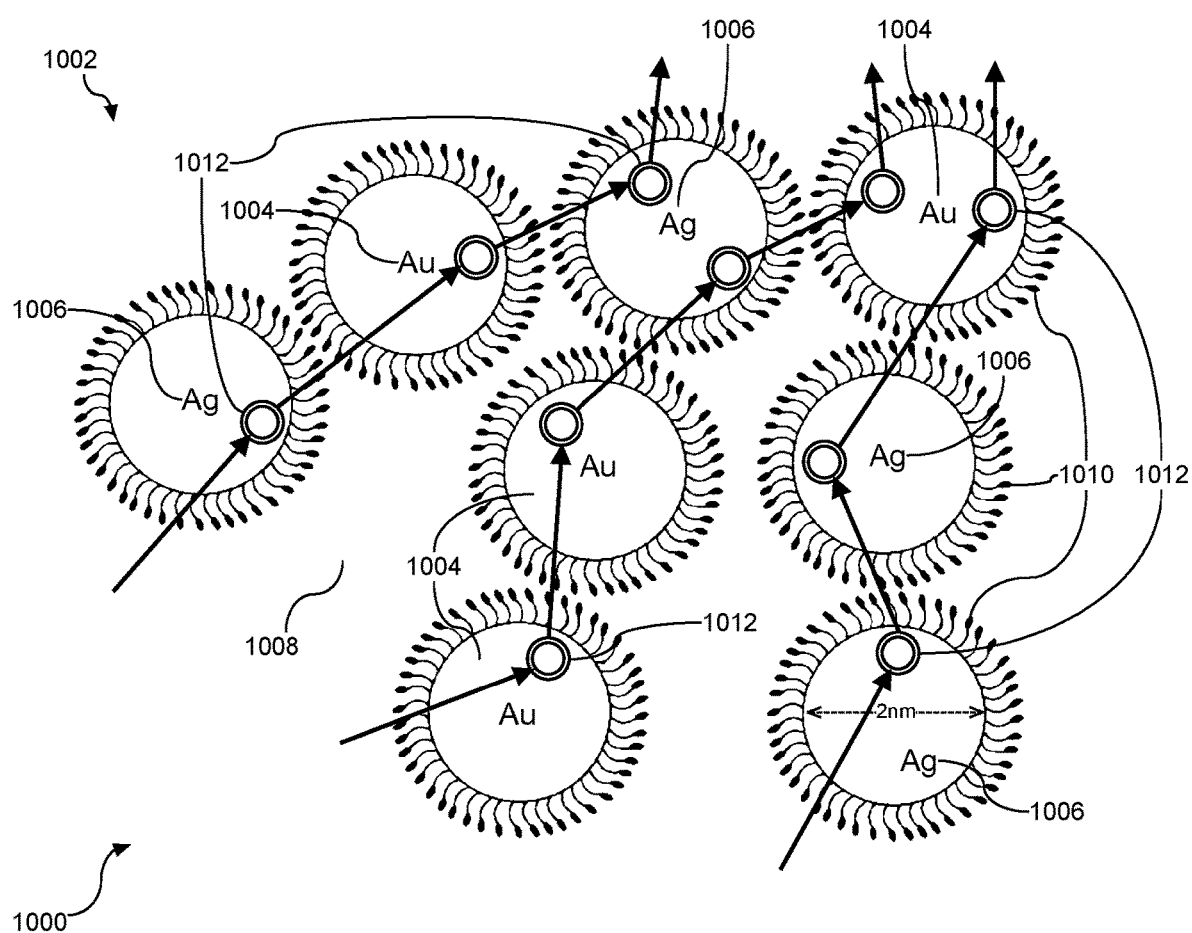
FIG. 10 is a schematic view of an embodiment of a nano-fluid including a plurality of nanoparticle clusters suspended in a dielectric medium.

Referring to FIG. 10, a diagram (1000) is provided to illustrate a schematic view of an embodiment of a fluid (1002), also referred to herein as a nano-fluid. As shown, the nano-fluid (1002) includes a plurality of gold (Au) nanoparticle clusters (1004) and a plurality of silver (Ag) nanoparticle clusters (1006) suspended in a dielectric medium (1008). In some embodiments, and without limitation, the dielectric medium (1008) is an alcohol, a ketone (e.g., acetone), an ether, a glycol, an olefin, and/or an alkane (e.g., those alkanes with greater than three carbon atoms, e.g., tetradecane). In an embodiment, the dielectric medium (1008) is water or silicone oil. Alternatively, the dielectric medium (1008) is a sol-gel with aerogel-like properties and low thermal conductivity values that reduce heat transfer therethrough, e.g., thermal conductivity values as low as 0.013 watts per meter-degrees Kelvin (W/m-K) as compared to the thermal conductivity of water at 20 degrees Celsius (° C.) of 0.6 W/m-K. Appropriate materials are selected prior to fabricating the nanoparticle clusters (1004) and (1006). The materials selected for the nanoparticle clusters (1004) and (1006) should have work function values that are greater than the work function values for associated electrodes, such as the electrodes (902) and (904) of FIG. 9. For example, the work function values of the Au nanoparticle clusters (604) and the Ag nanoparticle clusters (1006) are about 4.1 eV and 3.8 eV, respectively.

At least one layer of a dielectric coating (1010), such as a monolayer of alkanethiol material, is deposited on the Au nanoparticle clusters (1004) and the Ag nanoparticle clusters (1006) to form a dielectric barrier thereon. In an exemplary embodiment, the deposit of the dielectric coating (1010) is via electrospray. The alkanethiol material of the dielectric coating (1010) includes, but is not limited to, dodecanethiol and/or decanethiol. The deposit of the dielectric coating (1010), such as alkanethiol, reduces coalescence of the nanoparticle clusters (1004) and (1006). In at least one embodiment, the nanoparticle clusters (1004) and (1006) have a diameter in the range of about 1 nm to about 3 nm. In an exemplary embodiment, the nanoparticle clusters (1004) and (1006) have a diameter of about 2 nm. The Au nanoparticle clusters (1004) and the Ag nanoparticle clusters (1006) are tailored to be electrically conductive with charge storage features (i.e., capacitive features), minimize heat transfer through associate spacer apertures, with low thermal conductivity values, minimize ohmic heating, eliminate space charges in the spacer apertures, and prevent arcing. The plurality of Au nanoparticle clusters (1004) and the Ag nanoparticle clusters (1006) are suspended in the dielectric medium (1008). Accordingly, the nano-fluid (1002), including the suspended nanoparticle clusters (1004) and (1006), provides a conductive pathway for electrons to travel across the spacer apertures (906) from, for example with reference to FIG. 9, the emitter electrode (902) to the collector electrode (904) through charge transfer. Accordingly, in at least one embodiment, a plurality of the Au nanoparticle clusters (1004) and the Ag nanoparticle clusters (1006) are mixed together in the dielectric medium (1008) to form the nano-fluid (1002), the nano-fluid (1002) residing in the apertures (908) of FIG. 9.

The Au nanoparticle clusters (1004) according to exemplary embodiments are dodecanethiol functionalized gold nanoparticles, with an average particle size of about 1 nm to about 3 nm, at about 2% (weight/volume (grams/ml)). The Ag nanoparticle clusters (1006) are dodecanethiol functionalized silver nanoparticles, with an average particle size of about 1 nm to about 3 nm, at about 0.25% (weight/volume percent). In an embodiment, the average particle size of both the Au and Ag nanoparticle clusters (1004) and (1006) is at or about 2 nm. The Au and Ag cores of the nanoparticle clusters (1004) and (1006) are selected for their abilities to store and transfer electrons. In an embodiment, a 50%-50% mixture of Au and Ag nanoparticle clusters (1004) and (1006) are used. However, a mixture in the range of 1-99% Au-to-Ag could be used as well. Electron transfers are more likely to occur between nanoparticle clusters (1004) and (1006) with different work functions. In an exemplary embodiment, a mixture of nearly equal (molar) numbers of two different nanoparticle clusters (1004) and (1006), e.g., Au and Ag, provides good electron transfer. Accordingly, nanoparticle clusters are selected based on particle size, particle material (with the associated work function values), mixture ratio, and electron affinity.

Conductivity of the nano-fluid (1002) can be increased by increasing concentration of the nanoparticle clusters (1004) and (1006). The nanoparticle clusters (1004) and (1006) may have a concentration within the nano-fluid (1002) of, for example, about 0.1 mole/liter to about 2 moles/liter. In at least one embodiment, the Au and Ag nanoparticle clusters (1004) and (1006) each have a concentration of at least 1 mole/liter. Accordingly, in at least one embodiment, a plurality of Au and Ag nanoparticle clusters (1004) and (1006) are mixed together in a dielectric medium (1008) to form a nano-fluid (1002), the nano-fluid (1002) residing in, for example, the apertures (908) of FIG. 9.

The stability and reactivity of colloidal particles, such as Au and Ag nanoparticle clusters (1004) and (1006), are determined largely by a ligand shell formed by the alkanethiol coating (1010) adsorbed or covalently bound to the surface of the nanoparticle clusters (1004) and (1006). The nanoparticle clusters (1004) and (1006) tend to aggregate and precipitate, which can be prevented by the presence of a ligand shell of the non-aggregating polymer alkanethiol coating (1010) enabling these nanoparticle clusters (1004) and (1006) to remain suspended. Adsorbed or covalently attached ligands can act as stabilizers against agglomeration and can be used to impart chemical functionality to the nanoparticle clusters (1004) and (1006). Over time, the surfactant nature of the ligand coatings is overcome and the lower energy state of agglomerated nanoparticle clusters is formed. Therefore, over time, agglomeration may occur due to the lower energy condition of nanoparticle cluster accumulation and occasional addition of a surfactant may be used. Examples of surfactants include, without limitation, TWEEN®-20 and TWEEN®-21.

In the case of the nano-fluid (1000) of FIG. 10 substituted for the nano-fluid (912) of FIG. 9, electron transfer through collisions of the plurality of nanoparticle clusters (1004) and (1006) is illustrated. The work function values of the nanoparticle clusters (1004) and (1006) are much greater than the work function values of the emitter electrode (902) (about 0.5 eV to about 2.0 eV) and the collector electrode (904) (about 0.5 eV to about 2.0 eV). The nanoparticle clusters (1004) and (1006) are tailored to be electrically conductive with capacitive (i.e., charge storage) features while minimizing heat transfer therethrough. Accordingly, the suspended nanoparticle clusters (1004) and (1006) provide a conductive pathway for electrons to travel across the apertures (908) from the emitter electrode (902) to the collector electrode (904) through charge transfer.

Thermally-induced Brownian motion causes the nanoparticle clusters (1004) and (1006) to move within the dielectric medium (1008), and during this movement the nanoparticle clusters (1004) and (1006) occasionally collide with each other and with the electrodes (902) and (904). As the nanoparticle clusters (1004) and (1006) move and collide within the dielectric medium (1008), the nanoparticle clusters (1004) and (1006) chemically and physically transfer charge. The nanoparticle clusters (1004) and (1006) transfer charge chemically when electrons (1012) hop from the electrodes (902) and (904) to the nanoparticle clusters (1004) and (1006) and from one nanoparticle cluster (1004) and (1006) to another nanoparticle cluster. The hops primarily occur during collisions. Due to differences in work function values, electrons (1012) are more likely to move from the emitter electrode (902) to the collector electrode (904) via the nanoparticle clusters (1004) and (1006) rather than in the reverse direction. Accordingly, a net electron current from the emitter electrode (902) to the collector electrode (904) via the nanoparticle clusters (1004) and (1006) is the primary and dominant current of the energy harvesting device (900).

The nanoparticle clusters (1004) and (1006) transfer charge physically (i.e., undergo transient charging) due to the ionization of the nanoparticle clusters (1004) and (1006) upon receipt of an electron, and the electric field generated by the differently charged electrodes (902) and (904). The nanoparticle clusters (1004) and (1006) become ionized in collisions when they gain or lose an electron (1012). Positive and negative charged nanoparticle clusters (1004) and (1006) in the nano-fluid (1002) migrate to the negatively charged collector electrode (904) and the positively charged emitter electrode (902), respectively, providing an electrical current flow. This ion current flow is in the opposite direction from the electron current flow, but less in magnitude than the electron flow.

Some ion recombination in the nano-fluid (1002) may occur, which diminishes both the electron and ion current flow. Electrode separation may be selected at an optimum width to maximize ion formation and minimize ion recombination. In an exemplary embodiment, the electrode separation (910) is less than about 10 nm to support maximization of ion formation and minimization of ion recombination. The nanoparticle clusters (1004) and (1006) have a maximum dimension of, for example, about 2 nm. The electrode separation distance (910) as defined by the spacer (906) has an upper limit of, for example, about 20 nm, and the electrode separation distance (910) is equivalent to approximately 10 nanoparticle clusters (1004) and (1006). Therefore, the electrode separation distance (910) of about 20 nm provides sufficient space within the apertures (908) for nanoparticle clusters (1004) and (1006) to move around and collide, while minimizing ion recombination. For example, in an embodiment, an electron can hop from the emitter electrode (902) to a first set of nanoparticle clusters (1004) and (1006) and then to a second, third, fourth, or fifth set of nanoparticle clusters (1004) and (1006) before hopping to the collector electrode (904). A reduced quantity of hops mitigates ion recombination opportunities. Accordingly, ion recombination in the nano-fluid (1002) is minimized through an electrode separation distance selected at an optimum width to maximize ion formation and minimize ion recombination.

When the emitter electrode (902) and the collector electrode (904) are initially brought into close proximity, the electrons of the collector electrode (904) have a higher Fermi level than the electrons of the emitter electrode (902) due to the lower work function of the collector electrode (904). The difference in Fermi levels drives a net electron current that transfers electrons from the collector electrode (904) to the emitter electrode (902) until the Fermi levels are equal, i.e., the electrochemical potentials are balanced and thermodynamic equilibrium is achieved. The transfer of electrons between the emitter electrode (902) and the collector electrode (904) results in a difference in charge between the emitter electrode (902) and the collector electrode (904). This charge difference sets up the voltage of the contact potential difference and an electric field between the emitter electrode (902) and the collector electrode (904), where the polarity of the contact potential difference is determined by the material having the greatest work function. With the Fermi levels equalized, no net current will flow between the emitter electrode (902) and the collector electrode (904). Accordingly, electrically coupling the emitter electrode (902) and the collector electrode (904) with no external load results in attaining the contact potential difference between the electrodes (902) and (904) and no net current flow between the electrodes (902) and (904) due to attainment of thermodynamic equilibrium between the two electrodes (902) and (904).

The energy harvesting device (900) can generate electric power at room temperature with or without additional heat input. Heat added to the emitter electrode (902) will raise its temperature and the Fermi level of its electrons. With the Fermi level of the emitter electrode (902) higher than the Fermi level of the collector electrode (904), a net electron current will flow from the emitter electrode (902) to the collector electrode (904) through the nano-fluid (912), (1002). If the device (900) is placed into an external circuit, as shown and described in FIG. 12, such that the external circuit is connected to the electrodes (902) and (904), the same amount of electron current will flow through the external circuit current from the collector electrode (904) to the emitter electrode (902). Heat energy added to the emitter electrode (902) is carried by the electrons (1012) to the collector electrode (902). The bulk of the added energy is transferred to the external circuit for conversion to useful work, some of the added energy is transferred through collisions of the nanoparticle clusters (1004) and (1006) with the collector electrode (904), and some of the added energy is lost to ambient as waste energy. As the energy input to the emitter electrode (902) increases, the temperature of the emitter electrode (902) increases, and the electron transmission from the emitter electrode (902) increases, thereby generating more electron current. As the emitter electrode (902) releases electrons onto the nanoparticle clusters (1004) and (1006), energy is stored in the energy harvesting device (900). Accordingly, the energy harvesting device (900) generates, stores, and transfers charge and moves heat energy associated with a temperature difference, where added thermal energy causes the production of electrons to increase from the emitter electrode (902) into the nano-fluid (912), (1002).

The nano-fluid (1002) can be substituted into the device (900) of FIG. 9 and used to transfer charges from the emitter electrode (902) to one of the mobile nanoparticle clusters (1004) and (1006) via intermediate contact potential differences from the collisions of the nanoparticle cluster (1004) and (1006) with the emitter electrode (902) induced by Brownian motion of the nanoparticle clusters (1004) and (1006). Selection of dissimilar nanoparticle clusters (1004) and (1006) that include Au nanoparticle clusters (1004) and Ag nanoparticle clusters (1006) that have much greater work functions of about 4.1 eV and about 3.8 eV, respectively, than the work functions of the electrodes (902) and (904), improves transfer of electrons to the nanoparticle clusters (1004) and (1006) from the emitter electrode (902) to the collector electrode (904). This relationship of the work function values of the Au and Ag nanoparticle clusters (1004) and (1006) improves the transfer of electrons to the nanoparticle clusters (1004) and (1006) through Brownian motion and electron hopping. Accordingly, the selection of materials within the energy harvesting device (900) improves electric current generation and transfer therein through enhancing the release of electrons from the emitter electrode (902) and the conduction of the released electrons across the nano-fluid (912), (1002) to the collector electrode (904).

As the electrons (1012) hop from nanoparticle cluster (1004) and (1006) to nanoparticle cluster (1004) and (1006), single electron charging effects that include the additional work required to hop an electron (1012) onto a nanoparticle cluster (1004) and (1006) if an electron (1012) is already present on the nanoparticle cluster (1004) and (1006), determine if hopping additional electrons (1012) onto that particular nanoparticle cluster (1004) and (1006) is possible. Specifically, the nanoparticle clusters (1004) and (1006) include a voltage feedback mechanism that prevents the hopping of more than a predetermined number of electrons to the nanoparticle cluster (1004) and (1006). This prevents more than the allowed number of electrons (1012) from residing on the nanoparticle cluster (1004) and (1006) simultaneously. In an embodiment, only one electron (1012) is permitted on any nanoparticle cluster (1004) and (006) at any one time. Therefore, during conduction of current through the nano-fluid (1002), a single electron (1012) hops onto the nanoparticle cluster (1004) and (1006). The electron (1012) does not remain on the nanoparticle cluster (1004) and (1006) indefinitely, but hops off to either the next nanoparticle cluster (1004) and (1006) or the collector electrode (904) through collisions resulting from the Brownian motion of the nanoparticle clusters (1004) and (1006). However, the electron (1012) does remain on the nanoparticle cluster (1004) and (1006) long enough to provide the voltage feedback required to prevent additional electrons (1012) from hopping simultaneously onto the nanoparticle clusters (1004) and (1006). The hopping of electrons (1012) across the nanoparticle clusters (1004) and (1006) avoids resistive heating associated with current flow in a media. Notably, the energy harvesting device (900) containing the nano-fluid (1002) does not require pre-charging by an external power source in order to introduce electrostatic forces. This is due to the device (900) being self-charged with triboelectric charges generated upon contact between the nanoparticle clusters (1004) and (1006) due to Brownian motion. Accordingly, the electron hopping across the nano-fluid (1002) is limited to one electron (1012) at a time residing on a nanoparticle cluster (1004) and (1006).

As the electrical current starts to flow through the nano-fluid (1002), a substantial energy flux away from the emitter fluid (902) is made possible by the net energy exchange between emitted and replacement electrons (1012). The replacement electrons from an electrical conductor connected to the emitter electrode (902) do not arrive with a value of energy equivalent to an average value of the Fermi energy associated with the material of emitter electrode (902), but with an energy that is lower than the average value of the Fermi energy. Therefore, rather than the replacement energy of the replacement electrons being equal to the chemical potential of the emitter electrode (902), the electron replacement process takes place in the available energy states below the Fermi energy in the emitter electrode (902). The process through which electrons are emitted above the Fermi level and are replaced with electrons below the Fermi energy is sometimes referred to as an inverse Nottingham effect. Accordingly, a low work function value of about 0.5 eV for the emitter electrode (902) allows for the replacement of the emitted electrons with electrons with a lower energy level to induce a cooling effect on the emitter electrode (902).

As described this far, the principal electron transfer mechanism for operation of the energy harvesting device (900) is thermionic energy conversion or harvesting. In some embodiments, thermoelectric energy conversion is conducted in parallel with the thermionic energy conversion. For example and referring to FIG. 10, an electron (1012) colliding with a nanoparticle cluster (1004) and (1006) with a first energy may induce the emission of two electrons at second and third energy levels, respectively, where the first energy level is greater than the sum of the second and third energy levels. In such circumstances, the energy levels of the emitted electrons are not as important as the number of electrons.

A plurality of energy harvesting devices (900) is distinguished by at least one embodiment having the thermoelectric energy conversion features described herein. The nano-fluid (912), (1002) is selected for operation of the energy harvesting devices (900) within one or more temperature ranges. In an embodiment, the temperature range of the associated energy harvesting device (900) is controlled to modulate a power output of the device (900). In general, as the temperature of the emitter electrode (902) increases, the rate of thermionic emission therefrom increases. The operational temperature ranges for the nano-fluid (1002) are based on the desired output of the energy harvesting device (900), the temperature ranges that optimize thermionic conversion, the temperature ranges that optimize thermoelectric conversion, and fluid characteristics. Therefore, different embodiments of the nano-fluid (1002) are designed for different energy outputs of the device (900).

For example, in an embodiment, the temperature of the nano-fluid (912), (1002) is maintained at less than 250° C. to avoid deleterious changes in energy conversion due to the viscosity changes of the dielectric medium (1008) above 250° C. In an embodiment, the temperature range of the nano-fluid (1002) for substantially thermionic emission only is approximately room temperature (i.e., about 20° C. to about 25° C.) up to about 70-80° C., and the temperature range of the nano-fluid (1002) for thermionic and thermoelectric conversion is above 70-80° C., with the principle limitations being the temperature limitations of the materials. The nano-fluid (1002) for operation including thermoelectric conversion includes a temperature range that optimizes the thermoelectric conversion through optimizing the power density within the energy harvesting device (900), thereby optimizing the power output of the device (900). In at least one embodiment, a mechanism for regulating the temperature of the nano-fluid (1002) includes diverting some of the energy output of the device (900) into the nano-fluid (1002). Accordingly, the apertures (908) of specific embodiments of the energy harvesting device (900) may be filled with the nano-fluid (1002) to employ thermoelectric energy conversion with thermionic energy conversion above a particular temperature range, or thermionic energy conversion by itself below that temperature range.

As described herein, in at least one embodiment, the dielectric medium (1008) has thermal conductivity values less than about 1.0 watt per meter-degrees Kelvin (W/m-K). In at least one embodiment, the thermal conductivity of the dielectric medium (1008) is about 0.013 watt per meter-degrees Kelvin (W/m-K), as compared to the thermal conductivity of water at about 20 degrees Celsius (° C.) of about 0.6 W/m-K. Accordingly, the nano-fluid (1002) minimizes heat transfer through the apertures (908) of FIG. 9 with low thermal conductivity values. Since the heat transport in a low thermal conductivity nano-fluid (1002) can be small, a high temperature difference between the two electrodes (902) and (904) can be maintained during operation. These embodiments are designed for energy harvesting devices that employ thermionic emission where minimal heat transfer through the nano-fluid (912), (1002) is desired.

As shown in FIG. 9, the energy harvesting device (900) has an aperture (908) with a distance (910) between electrodes (902) and (904) that is within a range of about 1 nm to about 20 nm. In a portion of the electrode separation distance (910) of about 1 nm to about less than 10 nm, thermal conductivity values and electrical conductivity values of the nano-fluid (912), (1002) are enhanced beyond those conductivity values attained when the predetermined distance of the cavity (908) is greater than about 100 nm. This enhancement of thermal and electrical conductivity values of the nano-fluid (912), (1002) associated with the distance (910) of about 1 nm to 10 nm as compared to a distance (910) greater than 100 nm is due to a plurality of factors. Examples of a first factor include, but are not limited to, enhanced phonon and electron transfer between the plurality of nanoparticle clusters (1004) and (1006) within the nano-fluid (1002), enhanced phonon and electron transfer between the plurality of nanoparticle clusters (1004) and (1006) and the first electrode (902), and enhanced phonon and electron transfer between the plurality of nanoparticle clusters (1004) and (1006) and the second electrode (904).

A second factor is an enhanced influence of Brownian motion of the nanoparticle clusters (1004) and (1006) in a confining environment between the electrodes (902) and (904) to, e.g., less than about 10 nm. As the distance (910) between the electrodes (902) and (904) decreases below about 10 nm, fluid continuum characteristics of the nano-fluid (912), (1002) with the suspended nanoparticle clusters (1004) and (1006) is altered. For example, as the ratio of particle size to volume of the apertures (908) increases, random and convection like effects of Brownian motion in a dilute solution dominate. Therefore, collisions of the nanoparticle clusters (1004) and (1006) with the surfaces of other nanoparticle clusters (1004) and (1006) and the electrodes (902) and (904) increase thermal and electrical conductivity values due to the enhanced phonon and electron transfer.

A third factor is the at least partial formation of matrices of the nanoparticle clusters (1004) and (1006) within the nano-fluid (1002). Under certain conditions, the nanoparticle clusters (1004) and (1006) will form matrices within the nano-fluid (1002) as a function of close proximity to each other with some of the nanoparticle clusters (1008) remaining independent from the matrices. In an embodiment, the formation of the matrices is based on the factors of time and/or concentration of the nanoparticle clusters (1004) and (1006) in the nano-fluid (1002).

A fourth factor is the predetermined nanoparticle cluster (1004) and (1006) density, which in an embodiment is about one mole per liter. Accordingly, apertures (908) containing the nano-fluid (1002) with a distance (910) of about 1 nm to less than about 10 nm causes an increase in the thermal and electrical conductivity values of the nano-fluid (1002) therein.

In addition, the nanoparticle clusters (1004) and (1006) have a small characteristic length, e.g., about 2 nm, and they are often considered to have only one dimension. This characteristic length restricts electrons in a process called quantum confinement, which increases electrical conductivity. The collision of particles with different quantum confinement facilitates transfer of charge to the electrodes (902) and (904). The energy harvesting device (900) has an enhanced electrical conductivity value greater than about 1

Siemens per meter (S/m) as compared to the electrical conductivity of drinking water of about 0.005 S/m to about 0.05 S/m. Also, the embodiments of device (900) with the enhanced thermal conductivity have a thermal conductivity value greater than about 1 W/m-K as compared to the thermal conductivity of water at 20 degrees Celsius (° C.) of about 0.6 W/m-K.

Thermionic emission of electrons (1012) from the emitter electrode (902) and the transfer of the electrons (1012) across the nano-fluid (1002) from one nanoparticle cluster (1004) and (1006) to another nanoparticle cluster (1004) and (1006) through hopping are both quantum mechanical effects.

Release of electrons from the emitter electrode (902) through thermionic emission as described herein is an energy selective mechanism. A thermionic barrier in the apertures (908) between the emitter electrode (902) and the collector electrode (904) is induced through the interaction of the nanoparticles (1004) and (1006) with the electrodes (902) and (904) inside the apertures (908). The thermionic barrier is at least partially induced through the number and material composition of the plurality of nanoparticle clusters (1004) and (1006). The thermionic barrier induced through the nano-fluid (1002) provides an energy selective barrier on the order of magnitude of about 1 eV. Accordingly, the nano-fluid (1002) provides an energy selective barrier to electron emission and transmission.

To overcome the thermionic barrier and allow electrons (1012) to be emitted from the emitter electrode (902) above the energy level needed to overcome the barrier, materials for the emitter electrode (902) and the collector electrode (904) are selected for their work function values and Fermi level values. The Fermi levels of the two electrodes (902) and (904) and the nanoparticle clusters (1004) and (1006) will try to align by tunneling electrons (1012) from the electrodes (902) and (904) to the nanoparticle clusters (1004) and (1006). The difference in potential between the two electrodes (902) and (904) (described elsewhere herein) overcomes the thermionic barrier, and the thermionic emission of electrons (1012) from the emitter electrode (902) occurs with sufficient energy to overcome the thermionic block. Notably, and in general, for cooling purposes, removing higher energy electrons from the emitter electrode (902) causes the emission of electrons (1012) to carry away more heat energy from the emitter electrode (902) than is realized with lower energy electrons. Accordingly, the energy selective barrier is overcome through the thermionic emission of electrons at a higher energy level than would be otherwise occurring without the thermionic barrier.

Once the electrons (1012) have been emitted from the emitter electrode (902) through thermionic emission, the thermionic barrier continues to present an obstacle to further transmission of the electrons (1012) through the nano-fluid (1002). Smaller gaps on the order of about 1 nm to about 10 nm as compared to those gaps in excess of 100 nm facilitates electron hopping, i.e., field emission, of short distances across the apertures (908). Energy requirements for electron hopping are much lower than the energy requirements for thermionic emission; therefore, the electron hopping has a significant effect on the energy generation characteristics of the device (900). The design of the nano-fluid (1002) enables energy selective tunneling, e.g. electron hopping, that is a result of the barrier (which has a wider gap for low energy electrons) which results in electrons above the Fermi level being a principal hopping component. The direction of the electron hopping is determined through the selection of the different materials for the electrodes (902) and (904) and their associated work function and Fermi level values. The electron hopping across the nano-fluid (1002) transfers heat energy with electrons (1012) across the apertures (908) while maintaining a predetermined temperature gradient such that the temperature of the nano-fluid (1002) is relatively unchanged during the electron transfer. Accordingly, the emitted electrons transport heat energy from the emitter electrode (902) across the apertures (908) to the collector electrode (904) without increasing the temperature of the nano-fluid (1002).

Figure 11:
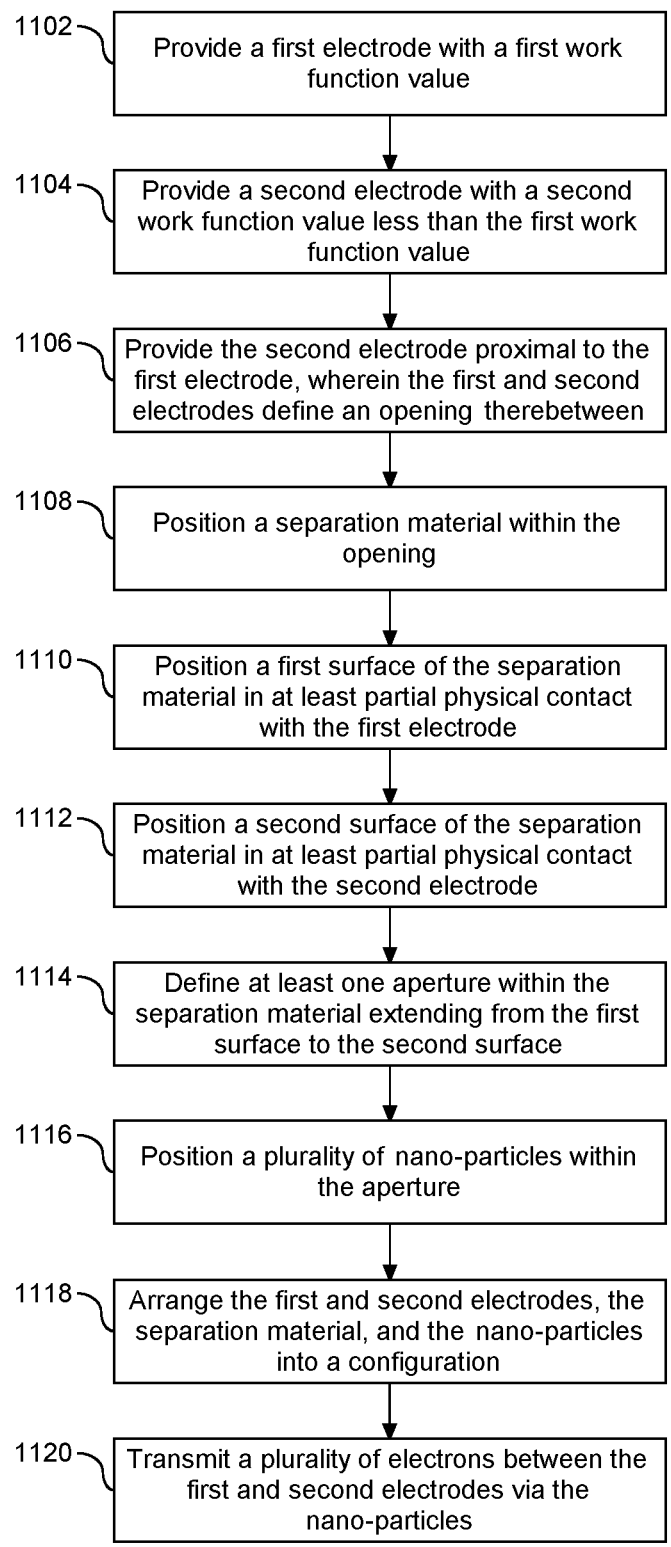
FIG. 11 is a flowchart illustrating a process for generating electric power with a thermionic energy harvesting device according to an exemplary embodiment.

Referring to FIG. 11, a flow chart (1100) is provided illustrating a process for generating electric power with the thermionic energy harvesting device. As described herein, a first electrode having a first work function value is provided (1102) and a second electrode having a second work function value is provided (1104). The work function value of the second electrode is less than the work function value of the first electrode. The first electrode and the second electrode are proximally positioned a predetermined distance from each other, i.e., about 1 nm to less than about 20 nm, to define an opening there between (1106). A separation material is positioned within the opening (1108). A first surface of the separation material is positioned in at least partial physical contact with the first electrode (1110), and a second surface of the separation material is positioned in at least partial physical contact with the second electrode (1112). At least one aperture is defined within the separation material, with the aperture extending from the first surface to the second surface (1114). A medium (e.g., nano-fluid) comprising a plurality of nanoparticles is positioned within the aperture(s) (1116).

Figure 12:
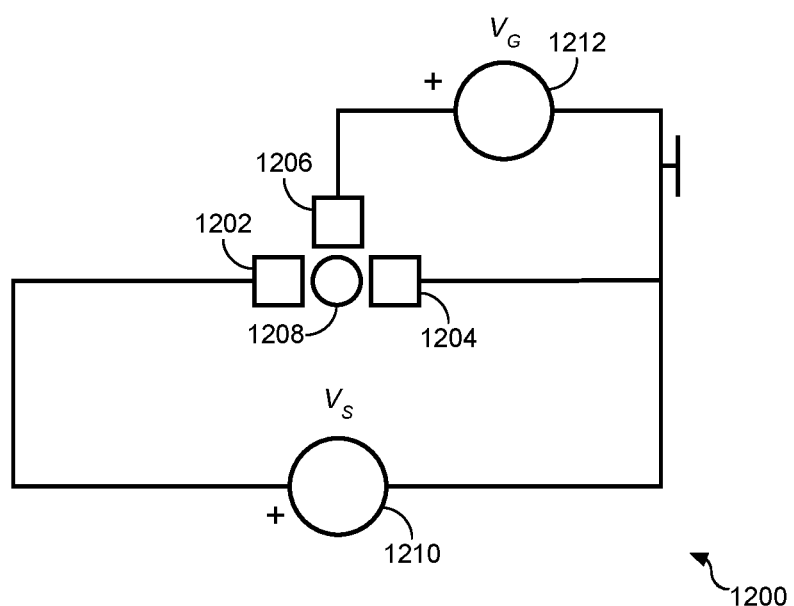
FIG. 12 is a schematic of a circuit containing the single electron transmitter of FIG. 2 with thermionic energy harvesting devices incorporated into the circuit as power sources according to an exemplary embodiment.

FIG. 12 is a schematic fragmented view of circuit diagram including a Single Electron Transistor ("SET"). The circuit diagram, generally designated by reference numeral (1200) in FIG. 12, includes a source electrode (1202), a drain electrode (1204), a gate electrode (106) each separated by respective junctions from a quantum island (1208). A first voltage source (1210) embodied as a first energy harvesting device applies a voltage $V_S$ to the source electrode (1202) and the drain electrode (1204). A second voltage source (1212) embodied as a second energy harvesting device applies a voltage $V_G$ to the gate electrode (1206). One or more first nanoscale connectors (not shown in FIG. 12), such as CNTs or SWCNTs, connect the source electrode (1202) to the quantum island (1208), and one or more second nanoscale connectors, such as CNTs or SWCNTs, connect the drain electrode (1204) to the quantum island (1208). The gate electrode (1206) is capacitively coupled to the quantum island (1208).

Aspects of the present embodiments are described herein with reference to one or more of flowchart illustrations and/or block diagrams of methods and apparatus (systems) according to the embodiments.

The terminology used herein is for the purpose of describing particular embodiments only and is not intended to be limiting of the embodiments. As used herein, the singular forms "a", "an" and "the" are intended to include the plural forms as well, unless the context clearly indicates otherwise. As used herein, the term "and/or" means either or both (or any combination or all of the terms or expressed referred to). It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications and combinations with one another as are suited to the particular use contemplated.

It will be appreciated that, although specific embodiments have been described herein for purposes of illustration, various modifications may be made without departing from the spirit and scope of the embodiments. Accordingly, the scope of protection of the embodiment(s) is limited only by the following claims and their equivalents.

What is claimed is:

1. A method for fabricating a single electron transistor, comprising:
    providing a substrate and a source electrode, a drain electrode, and a gate electrode on a substantially planar surface of the substrate, the source electrode and the drain electrode being spaced apart from one another by a gap;
    electrifying the source electrode and the drain electrode;
    electrospray depositing a single nanometer-scale conductive particle in the gap between the electrified source electrode and the drain electrode, the single nanometer-scale conductive particle having an effective size of not greater than 10 nanometers, the single nanometer-scale conductive particle separated from the source electrode by a first space and from the drain electrode by a second space;
    depositing at least one carbon nanotube on the substrate; and
    subjecting the at least one carbon nanotube to dielectrophoresis to position the at least one carbon nanotube within 1 nanometer of the single nanometer-scale conductive particle, the at least one carbon nanotube spanning the first space to establish a first connection between the source electrode and the single nanometer-scale conductive particle and spanning the second space to establish a second connection between the drain electrode and the single nanometer-scale conductive particle.

2. The method of claim 1, wherein the substrate is a non-semiconductor material.

3. The method of claim 1, further comprising electro spraying the substrate, the substantially planar surface having a variability of not greater than 1 nanometer as measured by a profilometer.

4. The method of claim 1, wherein the substantially planar surface is hydrophobic.

5. The method of claim 1, wherein the source electrode, the drain electrode, or the source and drain electrodes are comprised of graphene.

6. The method of claim 1, wherein the single nanometer-scale conductive particle is a polymeric sphere coated with a conductive material.

7. The method of claim 6, wherein the polymeric sphere comprises polystyrene latex.

8. The method of claim 6, wherein the conductive material comprises an alkanethiol.

9. The method of claim 1, wherein the electrospraying comprises:
    applying an electric field to extract a droplet from a nozzle, the droplet including the single nanometer-scale conductive particle; and
    configuring the electric field for driving the droplet toward the substantially planar surface of the substrate.

10. The method of claim 9, further comprising generating the electric field and a magnetic field with a combined extractor electrode.

11. The method of claim 10, wherein the extractor electrode has a toroid shape with an open center, and wherein the electrosprayed droplet passes through the open center of the extractor electrode.

12. The method of claim 1, further comprising:
    electrospraying nanoparticles on the substantially planar surface of the substrate to establish the source electrode, the drain electrode, the gate electrode, and the conductive traces.

13. The method of claim 1, wherein the at least one carbon nanotube comprises a single wall carbon nanotube.

14. The method of claim 1, wherein the at least one carbon nanotube is in physical contact with the single nanometer-scale conductive particle.

15. A single electron transistor, comprising:
    a substrate having a substantially planar surface;
    a source electrode on the substantially planar surface;
    a drain electrode on the substantially planar surface spaced apart from the source electrode by a gap;
    a gate electrode on the substantially planar surface;
    a single nanometer-scale conductive particle electrospray deposited in the gap between the electrified source electrode and the drain electrode, the single nanometer-scale conductive particle having an effective size of not greater than 10 nanometers, the single nanometer-scale conductive particle separated from the source electrode by a first space and from the drain electrode by a second space; and
    at least one carbon nanotube positioned within 1 nanometer of the single nanometer-scale conductive particle, the at least one carbon nanotube spanning the first space to establish a first connection between the source electrode and the single nanometer-scale conductive particle and spanning the second space to establish a second connection between the drain electrode and the single nanometer-scale conductive particle.

16. The single electron transistor of claim 15, wherein the substrate is a non-semiconductor material.

17. The single electron transistor of claim 15, wherein the single nanometer-scale conductive particle is a polymeric sphere coated with a conductive material, wherein the polymeric sphere comprises polystyrene latex, and wherein the conductive material comprises an alkanethiol.

18. The single electron transistor of claim 15, wherein the at least one carbon nanotube comprises a single wall carbon nanotube.

19. A circuit comprising:
    a single electron transistor comprising:
        a substrate having a substantially planar surface;
        a source electrode on the substantially planar surface;
        a drain electrode on the substantially planar surface spaced apart from the source electrode by a gap;
        a gate electrode on the substantially planar surface;

a single nanometer-scale conductive particle electrospray deposited in the gap between the electrified source electrode and the drain electrode, the single nanometer-scale conductive particle having an effective size of not greater than 10 nanometers, the single nanometer-scale conductive particle separated from the source electrode by a first space and from the drain electrode by a second space; and at least one carbon nanotube positioned within 1 nanometer of the single nanometer-scale conductive particle to span the first space and establish a first connection between the source electrode and the single nanometer-scale conductive particle and to span the second space and establish a second connection between the drain electrode and the single nanometer-scale conductive particle; and one or more power sources electrically connected to the single electron transistor, at least one of the one or more power sources comprising an energy harvesting device, the energy harvesting device comprising:

a first electrode;

a second electrode spaced from the first electrode to provide an inter-electrode gap between the first and second electrodes; and a plurality of nanoparticles suspended in a medium contained in the inter-electrode gap and arranged to permit electron transfer between the first and second electrodes.

20. The single electron transistor of claim 15, wherein a first distance between the single nanometer-scale conductive particle and the source electrode is equal to a second distance between the single nanometer-scale conductive particle and the drain electrode.

\* \* \* \* \*